United States Patent
Chung et al.

(10) Patent No.: US 7,049,226 B2
(45) Date of Patent: May 23, 2006

(54) INTEGRATION OF ALD TANTALUM NITRIDE FOR COPPER METALLIZATION

(75) Inventors: Hua Chung, San Jose, CA (US); Nirmalya Maity, Los Altos, CA (US); Jick Yu, San Jose, CA (US); Roderick Craig Mosely, Pleasanton, CA (US); Mei Chang, Saratoga, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 10/865,042

(22) Filed: Jun. 10, 2004

(65) Prior Publication Data
US 2005/0106865 A1  May 19, 2005

Related U.S. Application Data

(63) Continuation-in-part of application No. 10/193,333, filed on Jul. 10, 2002, and a continuation-in-part of application No. 09/965,370, filed on Sep. 26, 2001, and a continuation-in-part of application No. 09/965,373, filed on Sep. 26, 2001, and a continuation-in-part of application No. 09/965,369, filed on Sep. 26, 2001, now abandoned.

(60) Provisional application No. 60/478,663, filed on Jun. 13, 2003, and provisional application No. 60/346,086, filed on Oct. 26, 2001.

(51) Int. Cl.
*H01L 21/4763* (2006.01)

(52) U.S. Cl. ............. 438/648; 438/618; 438/622; 438/685

(58) Field of Classification Search .......... 438/618, 438/622, 648, 685
See application file for complete search history.

(56) References Cited

U.S. PATENT DOCUMENTS

| | | | |
|---|---|---|---|
| 2,430,520 A | 11/1947 | Marboe et al. |
| 3,291,456 A | 12/1966 | Deane |
| 3,356,527 A | 12/1967 | Moshier et al. |
| 3,594,216 A | 7/1971 | Charles et al. |
| 4,058,430 A | 11/1977 | Suntola et al. |
| 4,389,973 A | 6/1983 | Suntola et al. |
| 4,413,022 A | 11/1983 | Suntola et al. |
| 4,486,487 A | 12/1984 | Skarp |
| 4,614,639 A | 9/1986 | Hegedus |
| 4,732,110 A | 3/1988 | Parsons |
| 4,761,269 A | 8/1988 | Conger et al. |
| 4,767,494 A | 8/1988 | Kobayashi et al. |

(Continued)

FOREIGN PATENT DOCUMENTS

DE         4202889 A1    8/1993

(Continued)

OTHER PUBLICATIONS

Ritala, M., et al., "Perfectly conformal TiN and $Al_2O_3$ films deposited y atomic layer deposition," *Chemical Vapor Deposition*, vol. 5(1) (Jan. 1999), p. 7–9.

(Continued)

*Primary Examiner*—Alexander Ghyka
(74) *Attorney, Agent, or Firm*—Patterson & Sheridan, LLP

(57) ABSTRACT

A method and apparatus for depositing a tantalum nitride barrier layer is provided for use in an integrated processing tool. The tantalum nitride is deposited by atomic layer deposition. The tantalum nitride is removed from the bottom of features in dielectric layers to reveal the conductive material under the deposited tantalum nitride. Optionally, a tantalum layer may be deposited by physical vapor deposition after the tantalum nitride deposition. Optionally, the tantalum nitride deposition and the tantalum deposition may occur in the same processing chamber.

55 Claims, 13 Drawing Sheets

U.S. PATENT DOCUMENTS

| | | |
|---|---|---|
| 4,806,321 A | 2/1989 | Nishizawa et al. |
| 4,813,846 A | 3/1989 | Helms |
| 4,829,022 A | 5/1989 | Kobayashi et al. |
| 4,834,831 A | 5/1989 | Nishizawa et al. |
| 4,838,983 A | 6/1989 | Schumaker et al. |
| 4,838,993 A | 6/1989 | Aoki et al. |
| 4,840,921 A | 6/1989 | Matsumoto |
| 4,845,049 A | 7/1989 | Sunakawa |
| 4,859,625 A | 8/1989 | Matsumoto |
| 4,859,627 A | 8/1989 | Sunakawa |
| 4,861,417 A | 8/1989 | Mochizuki et al. |
| 4,876,218 A | 10/1989 | Pessa et al. |
| 4,907,534 A | 3/1990 | Huang et al. |
| 4,917,556 A | 4/1990 | Stark et al. |
| 4,927,670 A | 5/1990 | Erbil |
| 4,931,132 A | 6/1990 | Aspnes et al. |
| 4,951,601 A | 8/1990 | Maydan et al. |
| 4,960,720 A | 10/1990 | Shimbo |
| 4,975,252 A | 12/1990 | Nishizawa et al. |
| 4,987,856 A | 1/1991 | Hey et al. |
| 4,991,542 A | 2/1991 | Kohmura et al. |
| 4,993,357 A | 2/1991 | Scholz |
| 5,000,113 A | 3/1991 | Wang et al. |
| 5,013,683 A | 5/1991 | Petroff et al. |
| 5,028,565 A | 7/1991 | Chang et al. |
| 5,082,798 A | 1/1992 | Arimoto |
| 5,085,731 A | 2/1992 | Norman et al. |
| 5,085,885 A | 2/1992 | Foley et al. |
| 5,091,320 A | 2/1992 | Aspnes et al. |
| 5,098,516 A | 3/1992 | Norman et al. |
| 5,130,269 A | 7/1992 | Kitahara et al. |
| 5,166,092 A | 11/1992 | Mochizuki et al. |
| 5,173,474 A | 12/1992 | Connell et al. |
| 5,186,718 A | 2/1993 | Tepman et al. |
| 5,196,365 A | 3/1993 | Gotou |
| 5,204,145 A | 4/1993 | Gasworth |
| 5,205,077 A | 4/1993 | Wittstock |
| 5,221,449 A | 6/1993 | Colgan et al. |
| 5,225,366 A | 7/1993 | Yoder |
| 5,234,561 A | 8/1993 | Randhawa et al. |
| 5,246,536 A | 9/1993 | Nishizawa et al. |
| 5,250,148 A | 10/1993 | Nishizawa et al. |
| 5,254,207 A | 10/1993 | Nishizawa et al. |
| 5,256,244 A | 10/1993 | Ackerman |
| 5,259,881 A | 11/1993 | Edwards et al. |
| 5,261,959 A | 11/1993 | Gasworth |
| 5,264,038 A | 11/1993 | Hara et al. |
| 5,270,247 A | 12/1993 | Sakuma et al. |
| 5,273,775 A | 12/1993 | Dyer et al. |
| 5,278,435 A | 1/1994 | Van Hove et al. |
| 5,281,274 A | 1/1994 | Yoder |
| 5,281,485 A | 1/1994 | Colgan et al. |
| 5,286,296 A | 2/1994 | Sato et al. |
| 5,290,748 A | 3/1994 | Knuuttila et al. |
| 5,294,286 A | 3/1994 | Nishizawa et al. |
| 5,296,403 A | 3/1994 | Nishizawa et al. |
| 5,300,186 A | 4/1994 | Kitahara et al. |
| 5,306,666 A | 4/1994 | Izumi |
| 5,311,055 A | 5/1994 | Goodman et al. |
| 5,316,615 A | 5/1994 | Copel |
| 5,316,793 A | 5/1994 | Wallace et al. |
| 5,330,610 A | 7/1994 | Eres et al. |
| 5,336,324 A | 8/1994 | Stall et al. |
| 5,338,362 A | 8/1994 | Imahashi |
| 5,338,363 A | 8/1994 | Kawata et al. |
| 5,338,364 A | 8/1994 | Kurihara et al. |
| 5,338,389 A | 8/1994 | Nishizawa et al. |
| 5,348,911 A | 9/1994 | Jurgensen et al. |
| 5,374,570 A | 12/1994 | Nasu et al. |
| 5,395,791 A | 3/1995 | Cheng et al. |
| 5,438,952 A | 8/1995 | Otsuka |
| 5,439,876 A | 8/1995 | Graf et al. |
| 5,441,703 A | 8/1995 | Jurgensen |
| 5,443,033 A | 8/1995 | Nishizawa et al. |
| 5,443,647 A | 8/1995 | Aucoin et al. |
| 5,455,072 A | 10/1995 | Bension et al. |
| 5,458,084 A | 10/1995 | Thorne et al. |
| 5,464,666 A | 11/1995 | Fine et al. |
| 5,469,806 A | 11/1995 | Mochizuki et al. |
| 5,480,818 A | 1/1996 | Matsumoto et al. |
| 5,483,919 A | 1/1996 | Yokoyama et al. |
| 5,484,664 A | 1/1996 | Kitahara et al. |
| 5,496,410 A | 3/1996 | Fukuda et al. |
| 5,503,875 A | 4/1996 | Imai et al. |
| 5,521,126 A | 5/1996 | Okamura et al. |
| 5,526,244 A | 6/1996 | Bishop |
| 5,527,733 A | 6/1996 | Nishizawa et al. |
| 5,529,955 A | 6/1996 | Hibino et al. |
| 5,532,511 A | 7/1996 | Nishizawa et al. |
| 5,540,783 A | 7/1996 | Eres et al. |
| 5,580,380 A | 12/1996 | Liu et al. |
| 5,601,651 A | 2/1997 | Watabe |
| 5,609,689 A | 3/1997 | Kato et al. |
| 5,616,181 A | 4/1997 | Yamamoto et al. |
| 5,637,530 A | 6/1997 | Gaines et al. |
| 5,641,984 A | 6/1997 | Aftergut et al. |
| 5,644,128 A | 7/1997 | Wollnik et al. |
| 5,654,232 A | 8/1997 | Gardner |
| 5,667,592 A | 9/1997 | Boitnott et al. |
| 5,674,786 A | 10/1997 | Turner et al. |
| 5,693,139 A | 12/1997 | Nishizawa et al. |
| 5,695,564 A | 12/1997 | Imahashi |
| 5,705,224 A | 1/1998 | Murota et al. |
| 5,707,880 A | 1/1998 | Aftergut et al. |
| 5,711,811 A | 1/1998 | Suntola et al. |
| 5,730,801 A | 3/1998 | Tepman et al. |
| 5,730,802 A | 3/1998 | Ishizumi et al. |
| 5,744,394 A | 4/1998 | Iguchi et al. |
| 5,747,113 A | 5/1998 | Tsai |
| 5,749,974 A | 5/1998 | Habuka et al. |
| 5,788,447 A | 8/1998 | Yonemitsu et al. |
| 5,788,799 A | 8/1998 | Steger et al. |
| 5,796,116 A | 8/1998 | Nakata et al. |
| 5,801,634 A | 9/1998 | Young et al. |
| 5,804,488 A | 9/1998 | Shih et al. |
| 5,807,792 A | 9/1998 | Ilg et al. |
| 5,830,270 A | 11/1998 | McKee et al. |
| 5,835,677 A | 11/1998 | Li et al. |
| 5,838,677 A | 11/1998 | Kozaki et al. |
| 5,846,330 A | 12/1998 | Quirk et al. |
| 5,851,849 A | 12/1998 | Comizzoli et al. |
| 5,855,675 A | 1/1999 | Doering et al. |
| 5,855,680 A | 1/1999 | Soininen et al. |
| 5,856,219 A | 1/1999 | Naito et al. |
| 5,858,102 A | 1/1999 | Tsai |
| 5,866,213 A | 2/1999 | Foster et al. |
| 5,866,795 A | 2/1999 | Wang et al. |
| 5,879,459 A | 3/1999 | Gadgil et al. |
| 5,882,165 A | 3/1999 | Maydan et al. |
| 5,882,413 A | 3/1999 | Beaulieu et al. |
| 5,888,303 A | 3/1999 | Dixon |
| 5,904,565 A | 5/1999 | Nguyen et al. |
| 5,913,147 A | 6/1999 | Dubin et al. |
| 5,916,365 A | 6/1999 | Sherman |
| 5,923,056 A | 7/1999 | Lee et al. |
| 5,923,985 A | 7/1999 | Aoki et al. |
| 5,925,574 A | 7/1999 | Aoki et al. |
| 5,928,389 A | 7/1999 | Jevtic |
| 5,933,753 A | 8/1999 | Simon et al. |
| 5,942,040 A | 8/1999 | Kim et al. |
| 5,947,710 A | 9/1999 | Cooper et al. |

| | | | | | | |
|---|---|---|---|---|---|---|
| 5,951,771 | A | 9/1999 | Raney et al. | 6,391,785 B1 | 5/2002 | Satta et al. |
| 5,972,430 | A | 10/1999 | DiMeo, Jr. et al. | 6,399,491 B1 | 6/2002 | Jeon et al. |
| 5,985,762 | A | 11/1999 | Geffken et al. | 6,416,577 B1 | 7/2002 | Suntoloa et al. |
| 5,996,528 | A | 12/1999 | Berrian et al. | 6,416,822 B1 | 7/2002 | Chiang et al. |
| 6,001,669 | A | 12/1999 | Gaines et al. | 6,420,189 B1 | 7/2002 | Lopatin |
| 6,015,590 | A | 1/2000 | Suntola et al. | 6,423,619 B1 | 7/2002 | Grant et al. |
| 6,015,917 | A | 1/2000 | Bhandari et al. | 6,428,859 B1 | 8/2002 | Chiang et al. |
| 6,025,627 | A | 2/2000 | Forbes et al. | 6,436,193 B1 | 8/2002 | Kasai et al. |
| 6,036,773 | A | 3/2000 | Wang et al. | 6,447,607 B1 | 9/2002 | Soininen et al. |
| 6,037,257 | A | 3/2000 | Chiang et al. | 6,447,933 B1 | 9/2002 | Wang et al. |
| 6,042,652 | A | 3/2000 | Hyun et al. | 6,451,119 B1 | 9/2002 | Sneh et al. |
| 6,043,177 | A | 3/2000 | Falconer et al. | 6,451,695 B1 | 9/2002 | Sneh |
| 6,051,286 | A | 4/2000 | Zhao et al. | 6,458,701 B1 | 10/2002 | Marsella et al. |
| 6,062,798 | A | 5/2000 | Muka | 6,464,779 B1 | 10/2002 | Powell et al. |
| 6,066,358 | A | 5/2000 | Guo et al. | 6,465,924 B1 | 10/2002 | Maejima |
| 6,066,892 | A | 5/2000 | Ding et al. | 6,475,276 B1 | 11/2002 | Elers et al. |
| 6,071,808 | A | 6/2000 | Merchant et al. | 6,475,910 B1 | 11/2002 | Sneh |
| 6,084,302 | A | 7/2000 | Sandhu | 6,478,872 B1 | 11/2002 | Chae et al. |
| 6,086,677 | A | 7/2000 | Umotoy et al. | 6,481,945 B1 | 11/2002 | Hasper et al. |
| 6,107,192 | A | 8/2000 | Subrahmanyan et al. | 6,482,262 B1 | 11/2002 | Elers et al. |
| 6,110,556 | A | 8/2000 | Bang et al. | 6,482,733 B1 | 11/2002 | Raaijmakers et al. |
| 6,113,977 | A | 9/2000 | Soininen et al. | 6,482,740 B1 | 11/2002 | Soininen et al. |
| 6,117,244 | A | 9/2000 | Bang et al. | 6,489,214 B1 | 12/2002 | Kim et al. |
| 6,124,158 | A | 9/2000 | Dautartas et al. | 6,498,091 B1 | 12/2002 | Chen et al. |
| 6,130,147 | A | 10/2000 | Major et al. | 6,511,539 B1 | 1/2003 | Raaijmakers |
| 6,139,700 | A | 10/2000 | Kang et al. | 6,534,395 B1 | 3/2003 | Werkhoven et al. |
| 6,140,237 | A | 10/2000 | Chan et al. | 6,548,424 B1 | 4/2003 | Putkonen |
| 6,140,238 | A | 10/2000 | Kitch | 6,551,406 B1 | 4/2003 | Kilpi |
| 6,143,077 | A | 11/2000 | Ikeda et al. | 6,551,929 B1 | 4/2003 | Kori et al. |
| 6,143,659 | A | 11/2000 | Leem | 6,569,501 B1 | 5/2003 | Chiang et al. |
| 6,144,060 | A | 11/2000 | Park et al. | 6,572,705 B1 | 6/2003 | Suntola et al. |
| 6,158,446 | A | 12/2000 | Mohindra et al. | 6,575,705 B1 | 6/2003 | Akiyama et al. |
| 6,160,315 | A | 12/2000 | Chiang et al. | 6,578,287 B1 | 6/2003 | Aswad |
| 6,174,377 | B1 | 1/2001 | Doering et al. | 6,579,372 B1 | 6/2003 | Park |
| 6,174,809 | B1 | 1/2001 | Kang et al. | 6,585,823 B1 | 7/2003 | Van Wijck |
| 6,179,920 | B1 | 1/2001 | Tarutani et al. | 6,593,484 B1 | 7/2003 | Yasuhara et al. |
| 6,183,563 | B1 | 2/2001 | Choi et al. | 6,596,602 B1 | 7/2003 | Iizuka et al. |
| 6,197,683 | B1 | 3/2001 | Kang et al. | 6,599,572 B1 | 7/2003 | Saanila et al. |
| 6,200,893 | B1 | 3/2001 | Sneh | 6,607,976 B1 | 8/2003 | Chen et al. |
| 6,203,613 | B1 | 3/2001 | Gates et al. | 6,620,670 B1 | 9/2003 | Song et al. |
| 6,206,967 | B1 | 3/2001 | Mak et al. | 6,620,723 B1 | 9/2003 | Byun et al. |
| 6,207,302 | B1 | 3/2001 | Sugiura et al. | 6,620,956 B1 | 9/2003 | Chen et al. |
| 6,207,487 | B1 | 3/2001 | Kim et al. | 6,630,030 B1 | 10/2003 | Suntola et al. |
| 6,218,298 | B1 | 4/2001 | Hoinkis | 6,630,201 B1 | 10/2003 | Chiang et al. |
| 6,231,672 | B1 | 5/2001 | Choi et al. | 6,632,279 B1 | 10/2003 | Ritala et al. |
| 6,242,808 | B1 | 6/2001 | Shimizu et al. | 6,660,126 B1 | 12/2003 | Nguyen et al. |
| 6,248,605 | B1 | 6/2001 | Harkonen et al. | 6,660,622 B1 | 12/2003 | Chen et al. |
| 6,249,055 | B1 | 6/2001 | Dubin | 6,660,660 B1 | 12/2003 | Haukka et al. |
| 6,268,291 | B1 | 7/2001 | Andricacos et al. | 6,686,271 B1 | 2/2004 | Raaijmakers et al. |
| 6,270,572 | B1 | 8/2001 | Kim et al. | 6,784,096 B1 | 8/2004 | Chen et al. |
| 6,271,148 | B1 | 8/2001 | Kao et al. | 6,800,173 B1 | 10/2004 | Chiang et al. |
| 6,284,646 | B1 | 9/2001 | Leem | 6,803,272 B1 | 10/2004 | Halliyal et al. |
| 6,287,965 | B1 | 9/2001 | Kang et al. | 6,811,814 B1 | 11/2004 | Chen et al. |
| 6,291,876 | B1 | 9/2001 | Stumborg et al. | 6,815,285 B1 | 11/2004 | Choi et al. |
| 6,302,965 | B1 | 10/2001 | Umotoy et al. | 6,821,891 B1 | 11/2004 | Chen et al. |
| 6,305,314 | B1 | 10/2001 | Sneh et al. | 6,838,125 B1 | 1/2005 | Chung et al. |
| 6,306,216 | B1 | 10/2001 | Kim et al. | 6,893,915 B1 | 5/2005 | Park et al. |
| 6,316,098 | B1 | 11/2001 | Yitzchaik et al. | 2001/0000866 A1 | 5/2001 | Sneh et al. |
| 6,333,260 | B1 | 12/2001 | Kwon et al. | 2001/0002280 A1 | 5/2001 | Sneh |
| 6,334,983 | B1 | 1/2002 | Okayama et al. | 2001/0009140 A1 | 7/2001 | Bondestam et al. |
| 6,335,240 | B1 | 1/2002 | Kim et al. | 2001/0009695 A1 | 7/2001 | Saanila et al. |
| 6,335,280 | B1 | 1/2002 | Van der Jeugd | 2001/0011526 A1 | 8/2001 | Doering et al. |
| 6,342,277 | B1 | 1/2002 | Sherman et al. | 2001/0013312 A1 | 8/2001 | Soininen et al. |
| 6,348,376 | B1 | 2/2002 | Lim et al. | 2001/0014371 A1 | 8/2001 | Kilpi |
| 6,355,561 | B1 | 3/2002 | Sandhu et al. | 2001/0024387 A1 | 9/2001 | Raaijmakers et al. |
| 6,358,829 | B1 | 3/2002 | Yoon et al. | 2001/0025979 A1 | 10/2001 | Kim et al. |
| 6,368,954 | B1 | 4/2002 | Lopatin et al. | 2001/0028924 A1 | 10/2001 | Sherman |
| 6,369,430 | B1 | 4/2002 | Adetutu et al. | 2001/0029094 A1 | 10/2001 | Mee-Young et al. |
| 6,372,598 | B1 | 4/2002 | Kang et al. | 2001/0031562 A1 | 10/2001 | Raaijmakers et al. |
| 6,379,748 | B1 | 4/2002 | Bhandari et al. | 2001/0034123 A1 | 10/2001 | Jean et al. |
| 6,391,163 | B1 | 5/2002 | Pavate et al. | 2001/0041250 A1 | 11/2001 | Werkhoven et al. |

| Publication No. | Date | Inventor |
|---|---|---|
| 2001/0042523 A1 | 11/2001 | Kesala |
| 2001/0042799 A1 | 11/2001 | Kim et al. |
| 2001/0050039 A1 | 12/2001 | Park |
| 2001/0054377 A1 | 12/2001 | Lindfors et al. |
| 2001/0054730 A1 | 12/2001 | Kim et al. |
| 2001/0054769 A1 | 12/2001 | Raaijmakers et al. |
| 2002/0000196 A1 | 1/2002 | Park |
| 2002/0000598 A1 | 1/2002 | Kang et al. |
| 2002/0004293 A1 | 1/2002 | Soininen et al. |
| 2002/0007790 A1 | 1/2002 | Park |
| 2002/0009544 A1 | 1/2002 | McFeely et al. |
| 2002/0019121 A1 | 2/2002 | Pyo |
| 2002/0020869 A1 | 2/2002 | Park et al. |
| 2002/0021544 A1 | 2/2002 | Cho et al. |
| 2002/0031618 A1 | 3/2002 | Sheman |
| 2002/0037630 A1 | 3/2002 | Agarwal et al. |
| 2002/0041931 A1 | 4/2002 | Suntola et al. |
| 2002/0048635 A1 | 4/2002 | Kim et al. |
| 2002/0048880 A1 | 4/2002 | Lee |
| 2002/0052097 A1 | 5/2002 | Park |
| 2002/0055235 A1 | 5/2002 | Agarwal et al. |
| 2002/0061612 A1 | 5/2002 | Sandhu et al. |
| 2002/0066411 A1 | 6/2002 | Chiang et al. |
| 2002/0068458 A1 | 6/2002 | Chiang et al. |
| 2002/0073649 A1 | 6/2002 | Gamberini |
| 2002/0073924 A1 | 6/2002 | Chiang et al. |
| 2002/0074588 A1 | 6/2002 | Lee |
| 2002/0076481 A1 | 6/2002 | Chiang et al. |
| 2002/0076507 A1 | 6/2002 | Chiang et al. |
| 2002/0076508 A1 | 6/2002 | Chiang et al. |
| 2002/0076837 A1 | 6/2002 | Hujanen et al. |
| 2002/0081844 A1 | 6/2002 | Jeon et al. |
| 2002/0086106 A1 | 7/2002 | Park et al. |
| 2002/0086111 A1 | 7/2002 | Byun et al. |
| 2002/0086507 A1 | 7/2002 | Park et al. |
| 2002/0090829 A1 | 7/2002 | Sandhu et al. |
| 2002/0092471 A1 | 7/2002 | Kang et al. |
| 2002/0092584 A1 | 7/2002 | Soininen et al. |
| 2002/0094689 A1 | 7/2002 | Park |
| 2002/0098627 A1 | 7/2002 | Pomarede et al. |
| 2002/0098685 A1 | 7/2002 | Sophie et al. |
| 2002/0104481 A1 | 8/2002 | Chiang et al. |
| 2002/0105088 A1 | 8/2002 | Yang et al. |
| 2002/0106451 A1 | 8/2002 | Skarp et al. |
| 2002/0106536 A1 | 8/2002 | Lee et al. |
| 2002/0106846 A1 | 8/2002 | Seutter et al. |
| 2002/0108570 A1 | 8/2002 | Lindfors |
| 2002/0109168 A1 | 8/2002 | Kim et al. |
| 2002/0115252 A1 | 8/2002 | Haukka et al. |
| 2002/0115886 A1 | 8/2002 | Yasuhara et al. |
| 2002/0117399 A1 | 8/2002 | Chen et al. |
| 2002/0121241 A1 | 9/2002 | Nguyen et al. |
| 2002/0121342 A1 | 9/2002 | Nguyen et al. |
| 2002/0122884 A1 | 9/2002 | Chen et al. |
| 2002/0127336 A1 | 9/2002 | Chen et al. |
| 2002/0134307 A1 | 9/2002 | Choi |
| 2002/0135071 A1 | 9/2002 | Kang et al. |
| 2002/0144655 A1 | 10/2002 | Chiang et al. |
| 2002/0144657 A1 | 10/2002 | Chiang et al. |
| 2002/0144786 A1 | 10/2002 | Chiang et al. |
| 2002/0146511 A1 | 10/2002 | Chiang et al. |
| 2002/0155722 A1 | 10/2002 | Satta et al. |
| 2002/0162506 A1 | 11/2002 | Sneh et al. |
| 2002/0164421 A1 | 11/2002 | Chiang et al. |
| 2002/0164423 A1 | 11/2002 | Chiang et al. |
| 2002/0173130 A1 | 11/2002 | Pomerede et al. |
| 2002/0177282 A1 | 11/2002 | Song |
| 2002/0182320 A1 | 12/2002 | Leskela et al. |
| 2002/0187256 A1 | 12/2002 | Elers et al. |
| 2002/0187631 A1 | 12/2002 | Kim et al. |
| 2002/0196591 A1 | 12/2002 | Hujanen et al. |
| 2002/0197402 A1 | 12/2002 | Chiang et al. |
| 2002/0197863 A1 | 12/2002 | Mak et al. |
| 2002/0197881 A1 | 12/2002 | Ramdani et al. |
| 2003/0004723 A1 | 1/2003 | Chihara |
| 2003/0010451 A1 | 1/2003 | Tzu et al. |
| 2003/0013300 A1 | 1/2003 | Byun |
| 2003/0013320 A1 | 1/2003 | Kim et al. |
| 2003/0015764 A1 | 1/2003 | Raaijmakers et al. |
| 2003/0017697 A1 | 1/2003 | Choi et al. |
| 2003/0019428 A1 | 1/2003 | Ku et al. |
| 2003/0023338 A1 | 1/2003 | Chin et al. |
| 2003/0031807 A1 | 2/2003 | Elers et al. |
| 2003/0032281 A1 | 2/2003 | Werkhoven et al. |
| 2003/0042630 A1 | 3/2003 | Babcoke et al. |
| 2003/0049931 A1 | 3/2003 | Byun et al. |
| 2003/0049942 A1 | 3/2003 | Haukka et al. |
| 2003/0053799 A1 | 3/2003 | Lei |
| 2003/0054631 A1 | 3/2003 | Raaijmakers et al. |
| 2003/0057526 A1 | 3/2003 | Chung et al. |
| 2003/0057527 A1 | 3/2003 | Chung et al. |
| 2003/0059538 A1 | 3/2003 | Chung et al. |
| 2003/0060042 A1 | 3/2003 | Park et al. |
| 2003/0072884 A1 | 4/2003 | Zhang et al. |
| 2003/0072975 A1 | 4/2003 | Shero et al. |
| 2003/0075273 A1 | 4/2003 | Kilpela et al. |
| 2003/0075925 A1 | 4/2003 | Lindfors et al. |
| 2003/0079686 A1 | 5/2003 | Chen et al. |
| 2003/0082296 A1 | 5/2003 | Elers et al. |
| 2003/0082300 A1 | 5/2003 | Todd et al. |
| 2003/0082301 A1 | 5/2003 | Chen et al. |
| 2003/0082307 A1 | 5/2003 | Chung et al. |
| 2003/0087520 A1 | 5/2003 | Chen et al. |
| 2003/0089308 A1 | 5/2003 | Raaijmakers |
| 2003/0089942 A1 | 5/2003 | Bhattacharyya et al. |
| 2003/0096468 A1 | 5/2003 | Soininen et al. |
| 2003/0097013 A1 | 5/2003 | Chen et al. |
| 2003/0101927 A1 | 6/2003 | Raaijmakers |
| 2003/0104126 A1 | 6/2003 | Fang et al. |
| 2003/0106490 A1 | 6/2003 | Jallepally et al. |
| 2003/0108674 A1 | 6/2003 | Chung et al. |
| 2003/0113187 A1 | 6/2003 | Lei et al. |
| 2003/0116087 A1 | 6/2003 | Nguyen et al. |
| 2003/0116804 A1 | 6/2003 | Visokay et al. |
| 2003/0121469 A1 | 7/2003 | Lindfors et al. |
| 2003/0121608 A1 | 7/2003 | Chen et al. |
| 2003/0124262 A1 | 7/2003 | Chen et al. |
| 2003/0129308 A1 | 7/2003 | Chen et al. |
| 2003/0129826 A1 | 7/2003 | Werkhoven et al. |
| 2003/0134508 A1 | 7/2003 | Raaijmakers et al. |
| 2003/0140854 A1 | 7/2003 | Kilpi |
| 2003/0143328 A1 | 7/2003 | Chen et al. |
| 2003/0143747 A1 | 7/2003 | Bondestam et al. |
| 2003/0143839 A1 | 7/2003 | Raaijmakers et al. |
| 2003/0143841 A1 | 7/2003 | Yang et al. |
| 2003/0160277 A1 | 8/2003 | Bhattacharyya |
| 2003/0165615 A1 | 9/2003 | Aaltonen et al. |
| 2003/0168750 A1 | 9/2003 | Basceri et al. |
| 2003/0172872 A1 | 9/2003 | Thakur et al. |
| 2003/0173586 A1 | 9/2003 | Moriwaki et al. |
| 2003/0185980 A1 | 10/2003 | Endo |
| 2003/0186495 A1 | 10/2003 | Saanila et al. |
| 2003/0190423 A1 | 10/2003 | Yang et al. |
| 2003/0190497 A1 | 10/2003 | Yang et al. |
| 2003/0190804 A1 | 10/2003 | Glenn et al. |
| 2003/0194493 A1 | 10/2003 | Chang et al. |
| 2003/0198754 A1 | 10/2003 | Xi et al. |
| 2003/0205729 A1 | 11/2003 | Bascari et al. |
| 2003/0213560 A1 | 11/2003 | Wang et al. |
| 2003/0213987 A1 | 11/2003 | Basceri et al. |
| 2003/0216037 A1 | 11/2003 | Zhang et al. |
| 2003/0216981 A1 | 11/2003 | Tillmann |

| | | | | | | |
|---|---|---|---|---|---|---|
| 2003/0219942 A1 | 11/2003 | Choi et al. | | JP | 63-222420 | 9/1988 |
| 2003/0224107 A1 | 12/2003 | Hey et al. | | JP | 63-222421 | 9/1988 |
| 2003/0224578 A1 | 12/2003 | Chung et al. | | JP | 63-227007 | 9/1988 |
| 2003/0224600 A1 | 12/2003 | Cao et al. | | JP | 63-252420 | 10/1988 |
| 2003/0232142 A1 | 12/2003 | Bradley et al. | | JP | 63-266814 | 11/1988 |
| 2003/0232497 A1 | 12/2003 | Xi et al. | | JP | 64-009895 | 1/1989 |
| 2003/0232554 A1 | 12/2003 | Blum et al. | | JP | 64-009896 | 1/1989 |
| 2003/0235961 A1 | 12/2003 | Metzner et al. | | JP | 64-009897 | 1/1989 |
| 2004/0005749 A1 | 1/2004 | Choi et al. | | JP | 64-037832 | 2/1989 |
| 2004/0009307 A1 | 1/2004 | Koh et al. | | JP | 64-082615 | 3/1989 |
| 2004/0009665 A1 | 1/2004 | Chen et al. | | JP | 64-082617 | 3/1989 |
| 2004/0011504 A1 | 1/2004 | Ku et al. | | JP | 64-082671 | 3/1989 |
| 2004/0013577 A1 | 1/2004 | Ganguli et al. | | JP | 64-082676 | 3/1989 |
| 2004/0013803 A1 | 1/2004 | Chung et al. | | JP | 01-103982 | 4/1989 |
| 2004/0014320 A1 | 1/2004 | Chen et al. | | JP | 01-103996 | 4/1989 |
| 2004/0015300 A1 | 1/2004 | Ganguli et al. | | JP | 64-1090524 | 4/1989 |
| 2004/0016866 A1 | 1/2004 | Huang et al. | | JP | 01-117017 | 5/1989 |
| 2004/0018304 A1 | 1/2004 | Chung et al. | | JP | 01-143221 | 6/1989 |
| 2004/0018715 A1 | 1/2004 | Sun et al. | | JP | 01-154511 | 6/1989 |
| 2004/0018723 A1 | 1/2004 | Byun et al. | | JP | 01-143233 | 8/1989 |
| 2004/0018747 A1 | 1/2004 | Lee et al. | | JP | 01-245512 | 9/1989 |
| 2004/0028952 A1 | 2/2004 | Cartier et al. | | JP | 01-236657 | 10/1989 |
| 2004/0033698 A1 | 2/2004 | Lee et al. | | JP | 01-264218 | 10/1989 |
| 2004/0043630 A1 | 3/2004 | Vaartstra et al. | | JP | 01-270593 | 10/1989 |
| 2004/0046197 A1 | 3/2004 | Basceri et al. | | JP | 01-272108 | 10/1989 |
| 2004/0048491 A1 | 3/2004 | Jung et al. | | JP | 01-290221 | 11/1989 |
| 2004/0051152 A1 | 3/2004 | Nakajima | | JP | 01-290222 | 11/1989 |
| 2004/0053484 A1 | 3/2004 | Kumar et al. | | JP | 01-296673 | 11/1989 |
| 2004/0077183 A1 | 4/2004 | Chung et al. | | JP | 01-303770 | 12/1989 |
| 2004/0187304 A1 | 9/2004 | Chen et al. | | JP | 01-305894 | 12/1989 |
| 2004/0219784 A1 | 11/2004 | Kang et al. | | JP | 01-313927 | 12/1989 |
| 2004/0224506 A1 | 11/2004 | Choi et al. | | JP | 02-012814 | 1/1990 |
| 2004/0235285 A1 | 11/2004 | Kang et al. | | JP | 02-014513 | 1/1990 |
| 2004/0256351 A1 | 12/2004 | Chung et al. | | JP | 20-14513 | 1/1990 |
| 2005/0003075 A1 | 1/2005 | Bradley et al. | | JP | 02-017634 | 1/1990 |
| 2005/0006799 A1 | 1/2005 | Gregg et al. | | JP | 02-063115 | 3/1990 |
| 2005/0009325 A1 | 1/2005 | Chung et al. | | JP | 02-074029 | 3/1990 |
| 2005/0059240 A1 | 3/2005 | Choi et al. | | JP | 02-074587 | 3/1990 |
| 2005/0104142 A1 | 5/2005 | Narayanan et al. | | JP | 02-106822 | 4/1990 |
| 2005/0124154 A1 | 6/2005 | Park et al. | | JP | 02-129913 | 5/1990 |
| | | | | JP | 02-162717 | 6/1990 |
| FOREIGN PATENT DOCUMENTS | | | | JP | 02-172895 | 7/1990 |
| DE | 196 27 017 | 1/1997 | | JP | J02-196092 | 8/1990 |
| DE | 198 20 147 | 7/1999 | | JP | 02-203517 | 8/1990 |
| EP | 0 344 352 | 6/1988 | | JP | 02-230690 | 9/1990 |
| EP | 0 387 892 | 9/1990 | | JP | 02-230722 | 9/1990 |
| EP | 0429 270 | 5/1991 | | JP | 22-46161 | 9/1990 |
| EP | 0 429 270 | 5/1991 | | JP | 02-246161 | 9/1990 |
| EP | 0442 290 | 8/1991 | | JP | 02-264491 | 10/1990 |
| EP | 0 799 641 | 10/1997 | | JP | 02-283084 | 11/1990 |
| EP | 954027 A1 | 11/1999 | | JP | 02-304916 | 12/1990 |
| EP | 1 077 484 | 2/2001 | | JP | 03-02394 | 1/1991 |
| EP | 1142894 A2 | 10/2001 | | JP | 03-019211 | 1/1991 |
| EP | 1167569 A1 | 1/2002 | | JP | 03-022569 | 1/1991 |
| FR | 2 626 110 | 7/1989 | | JP | 03-023299 | 1/1991 |
| FR | 2 692 597 | 12/1993 | | JP | 03-044967 | 2/1991 |
| GB | 2355727 A | 5/2001 | | JP | 03-048421 | 3/1991 |
| JP | 58-098917 | 6/1983 | | JP | 03-070124 | 3/1991 |
| JP | 58-100419 | 6/1983 | | JP | 03-185716 | 8/1991 |
| JP | 60-065712 | 4/1985 | | JP | 03-208885 | 9/1991 |
| JP | 61-035847 | 2/1986 | | JP | 03-234025 | 10/1991 |
| JP | 61-210623 | 9/1986 | | JP | 32-34025 | 10/1991 |
| JP | 62-069508 | 3/1987 | | JP | 03-286522 | 12/1991 |
| JP | 62-091495 | 4/1987 | | JP | 03-286531 | 12/1991 |
| JP | 62-141717 | 6/1987 | | JP | 04-031391 | 2/1992 |
| JP | 62-167297 | 7/1987 | | JP | 04-031396 | 2/1992 |
| JP | 62-171999 | 7/1987 | | JP | 04-100292 | 4/1992 |
| JP | 62-232919 | 10/1987 | | JP | 04-111418 | 4/1992 |
| JP | 63-062313 | 3/1988 | | JP | 04-132214 | 5/1992 |
| JP | 63-085098 | 4/1988 | | JP | 04-132681 | 5/1992 |
| JP | 63-090833 | 4/1988 | | JP | 04-151822 | 5/1992 |

| | | | | | | |
|---|---|---|---|---|---|---|
| JP | 04-162418 | 6/1992 | | JP | 2001-172767 | 6/2001 |
| JP | 04-175299 | 6/1992 | | JP | 2001-217206 | 8/2001 |
| JP | 04-186824 | 7/1992 | | JP | 2001-220287 | 8/2001 |
| JP | 04-212411 | 8/1992 | | JP | 2001-220294 | 8/2001 |
| JP | 04-260696 | 9/1992 | | JP | 2001-240972 | 9/2001 |
| JP | 04-273120 | 9/1992 | | JP | 2001-254181 | 9/2001 |
| JP | 04-291916 | 9/1992 | | JP | 2001-284042 | 10/2001 |
| JP | 04-285167 | 10/1992 | | JP | 2001-303251 | 10/2001 |
| JP | 04-325500 | 11/1992 | | JP | 2001-328900 | 11/2001 |
| JP | 04-328874 | 11/1992 | | JP | 10-188840 | 12/2001 |
| JP | 50-29228 | 2/1993 | | JP | 2000-212752 | 11/2002 |
| JP | 05-029228 | 2/1993 | | JP | 2001-111000 | 12/2002 |
| JP | 05-047665 | 2/1993 | | JP | 2001-172767 | 10/2003 |
| JP | 05-047666 | 2/1993 | | WO | WO 90-02216 | 3/1990 |
| JP | 05-047668 | 2/1993 | | WO | WO 91-10510 A1 | 7/1991 |
| JP | 05-074717 | 3/1993 | | WO | WO 93-02111 A1 | 2/1993 |
| JP | 05-074724 | 3/1993 | | WO | WO 96-17107 A1 | 6/1996 |
| JP | 50-74724 | 3/1993 | | WO | WO 96/17107 | 6/1996 |
| JP | 05-102189 | 4/1993 | | WO | WO 96-18756 A1 | 6/1996 |
| JP | 05-160152 | 6/1993 | | WO | WO 98-06889 | 2/1998 |
| JP | 05-175143 | 7/1993 | | WO | WO 98-51838 | 11/1998 |
| JP | 05-175145 | 7/1993 | | WO | WO 99-01595 | 1/1999 |
| JP | 05-182906 | 7/1993 | | WO | WO 99/01595 | 1/1999 |
| JP | 05-186295 | 7/1993 | | WO | WO 99-29924 | 6/1999 |
| JP | 05-206036 | 8/1993 | | WO | WO 99/29924 | 6/1999 |
| JP | 05-234899 | 9/1993 | | WO | WO 99-65064 | 12/1999 |
| JP | 05-235047 | 9/1993 | | WO | WO 99/65064 | 12/1999 |
| JP | 05-251339 | 9/1993 | | WO | WO 00-11721 | 3/2000 |
| JP | 05-270997 | 10/1993 | | WO | WO 00-11721 A1 | 3/2000 |
| JP | 05-283336 | 10/1993 | | WO | WO 00-15865 | 3/2000 |
| JP | 05-291152 | 11/1993 | | WO | WO 00/15865 | 3/2000 |
| JP | 05-304334 | 11/1993 | | WO | WO 00-15881 | 3/2000 |
| JP | 05-343327 | 12/1993 | | WO | WO 00/16377 | 3/2000 |
| JP | 05-343685 | 12/1993 | | WO | WO 00-16377 | 3/2000 |
| JP | 06-045606 | 2/1994 | | WO | WO 00/54320 | 9/2000 |
| JP | 06-224138 | 5/1994 | | WO | WO 00-63957 | 10/2000 |
| JP | 61-77381 | 6/1994 | | WO | WO 00/63957 | 10/2000 |
| JP | 06-177381 | 6/1994 | | WO | WO 00/75964 A2 | 12/2000 |
| JP | 06-196809 | 7/1994 | | WO | WO00-79019 | 12/2000 |
| JP | 06-222388 | 8/1994 | | WO | WO 00/79576 A1 | 12/2000 |
| JP | 06-230421 | 8/1994 | | WO | WO 00-79576 A1 | 12/2000 |
| JP | 62-30421 | 8/1994 | | WO | WO 01-12891 A1 | 2/2001 |
| JP | 06-252057 | 9/1994 | | WO | WO 00-54320 | 3/2001 |
| JP | 06-291048 | 10/1994 | | WO | WO 01-15220 | 3/2001 |
| JP | 07-070752 | 3/1995 | | WO | WO 01/15220 A1 | 3/2001 |
| JP | 07-086269 | 3/1995 | | WO | WO 01-17691 A1 | 3/2001 |
| JP | 70-86269 | 3/1995 | | WO | WO 01/17692 A1 | 3/2001 |
| JP | 06-132236 | 7/1995 | | WO | WO 01-17692 | 3/2001 |
| JP | 07-300649 A | 11/1995 | | WO | WO 01/27346 A1 | 4/2001 |
| JP | 08-181076 | 7/1996 | | WO | WO 01-27346 | 4/2001 |
| JP | 08-245291 | 9/1996 | | WO | WO 01-27347 | 4/2001 |
| JP | 08-264530 | 10/1996 | | WO | WO 01/27347 A1 | 4/2001 |
| JP | 09-260786 | 10/1997 | | WO | WO 01-29280 A1 | 4/2001 |
| JP | 09-293681 | 11/1997 | | WO | WO 01/29280 A1 | 4/2001 |
| JP | 10-190128 | 7/1998 | | WO | WO 01-29891 | 4/2001 |
| JP | 11-269652 | 10/1999 | | WO | WO 01/29891 A1 | 4/2001 |
| JP | 2000-031387 | 1/2000 | | WO | WO 01/29893 A1 | 4/2001 |
| JP | 200-058777 | 2/2000 | | WO | WO 01-29893 | 4/2001 |
| JP | 2000-058777 | 2/2000 | | WO | WO 01/36702 A1 | 5/2001 |
| JP | 2000-068072 | 3/2000 | | WO | WO 01-36702 A1 | 5/2001 |
| JP | 2000-319772 | 3/2000 | | WO | WO 01-40541 A1 | 6/2001 |
| JP | 2000-138094 | 5/2000 | | WO | WO 99-41423 | 6/2001 |
| JP | 2000-218445 | 8/2000 | | WO | WO 01-66832 | 9/2001 |
| JP | 2001-020075 | 11/2000 | | WO | WO 01/66832 A2 | 9/2001 |
| JP | 2000-340883 | 12/2000 | | WO | WO 01/88972 A1 | 11/2001 |
| JP | 2000-353666 | 12/2000 | | WO | WO 02-01628 A2 | 1/2002 |
| JP | 10-308283 | 3/2001 | | WO | WO 02/01628 A2 | 1/2002 |
| JP | 2001-62244 | 3/2001 | | WO | WO 02-08485 A2 | 1/2002 |
| JP | 2001-152339 | 4/2001 | | WO | WO 02/08485 A2 | 1/2002 |
| JP | 2001-189312 | 5/2001 | | WO | WO 02-08488 A1 | 1/2002 |
| JP | 2000-087029 | 6/2001 | | WO | WO 99-13504 | 1/2002 |

| | | |
|---|---|---|
| WO | WO 02-27078 A1 | 4/2002 |
| WO | WO 02/31875 A2 | 4/2002 |
| WO | WO 02-43115 | 5/2002 |
| WO | WO 02/43115 A2 | 5/2002 |
| WO | WO 02-45167 | 6/2002 |
| WO | WO 02/45167 A2 | 6/2002 |
| WO | WO 02-45871 A1 | 6/2002 |
| WO | WO 02/46489 A1 | 6/2002 |
| WO | WO 02/45871 A1 | 8/2002 |
| WO | WO 02/067319 A2 | 8/2002 |
| WO | WO 02-067319 A2 | 8/2002 |
| WO | WO 02/068525 A1 | 8/2002 |
| WO | WO03/028090 | 4/2003 |
| WO | WO 03/044242 A2 | 5/2003 |

OTHER PUBLICATIONS

Kaanta, et al., "Dual Damascene: A ULSI Wiring Technology", Jun. 11–12, 1991 VMIC Conference TH–0359–0/91/0000–0144—pp. 144–152.

Hultman, et al., "Review of the thermal and mechanical stability of TiN–based thin films", Zeitschrift Fur Metallkunde, 90(10) (Oct. 1999), pp. 803–813.

Klaus, et al., "Atomic Layer Deposition of $SiO_2$ Using Catalyzed and Uncatalyzed Self–Limiting Surface Reactions", Surface Review & Letters, 6(3&4) (1999), pp. 435–448.

Yamaguchi, et al., "Atomic–layer chemical–vapor–deposition of silicon dioxide films with extremely low hydrogen content", Appl. Surf. Sci., vol. 130–132 (1988), pp. 202–207.

George, et al., "Surface Chemistry for Atomic Layer Growth", J. Phys. Chem., vol. 100 (1996), pp. 13121–131.

George, et al., "Atomic layer controlled deposition of $SiO_2$ and $Al_2O_3$ using ABAB . . . binary reaction sequence chemistry", Appl. Surf. Sci., vol. 82/83 (1994), pp. 460–467.

Wise, et al., "Diethyldiethoxysilane as a new precursor for $SiO_2$ growth on silicon", Mat. Res. Soc. Symp. Proc., vol. 334 (1994), pp. 37–43.

Niinisto, et al., "Synthesis of oxide thin films and overlayers by atomic layer epitaxy for advanced applications", Mat. Sci. & Eng., vol. B41 (1996), pp. 23–29.

Klaus, et al., "Atomically controlled growth of tungsten and tungsten nitride using sequential surface reactions". Appl. Surf. Sci., vol. 162–163 (2000), pp. 479–491.

Min, et al., "Atomic layer deposition of TiN thin films by sequential introduction of Ti precursor and NH/sub3/", Symp.: Advanced Interconnects and Contact Materials and Processes for Future Integrated Circuits (Apr. 13–16, 1988), pp. 337–342.

Klaus, et al., "Atomic Layer Deposition of Tungsten using Sequential Surface Chemistry with a Sacrificial Stripping Reaction," Thin Solid Films 360 (2000), pp. 145–153, (Accepted Nov. 16, 1999).

Min, et al., "Metal–Organic Atomic–Layer Deposition of Titanium–Silicon–Nitride Films", Applied Physics Letters, American Inst. Of Physics, vol. 75(11) (Sep. 13, 1999).

Martensson, et al., "Atomic Layer Epitaxy of Copper on Tantalum", Chemical Vapor Deposition, 3(1) (Feb. 1, 1997), pp. 45–50.

Ritala, et al. "Atomic Layer Epitaxy Growth of TiN Thin Films", J. Electrochem. Soc., 142(8) (Aug. 1995), pp. 2731–2737.

Elers, et al., "NbCl5 as a precursor in atomic layer epitaxy", Appl. Surf. Sci., vol. 82/83 (1994), pp. 468–474.

Lee, "The Preparation of Titanium–Based Thin Film by CVD Using Titanium Chlorides as Precursors", Chemical Vapor Deposition, 5(2) (Mar. 1999), pp. 69–73.

Martensson, et al., "Atomic Layer Epitaxy of Copper, Growth & Selectivity in the Cu (II)–2,2.6,6–Tetramethyl–3, 5–Heptanedion ATE/H2 Process", J. Electrochem. Soc., 145(8) (Aug. 1998), pp. 2926–2931.

Min, et al., "Chemical Vapor Depostion of Ti–Si–N Films with Alternating Source Supply", Mat. Res. Soc. Symp. Proc., vol. 564 (Apr. 5, 1999), pp. 207–210.

Bedair, "Atomic layer epitaxy deposition processes", J. Vac. Sci. Techol. 12(1) (Jan./Feb. 1994).

Yamaga, et al., "Atomic layer epitaxy of ZnS by a new gas supplying system in a low–pressure metalorganic vapor phase epitaxy", J. of Crystal Growth 117 (1992), pp. 152–155.

Elam, et al., "Nucleation and growth during tungsten atomic layer deposition on $SiO_2$ surfaces," Thin Solid Films 386 (2001) pp. 41–52, (Accepted Dec. 14, 2000).

Ohba, et al., "Thermal Decomposition of Methylhydrazine and Deposition Properties of CVD TiN Thin Films", Conference Proceedings, Advanced Metallization for ULSI Applications in 1993 (1994), pp. 143–149.

Scheper, et al., "Low–temperature deposition of titanium nitride films from dialkylhydrazine–based precursors", Materials Science in Semiconductor Processing 2 (1999), pp. 149–157.

Suzuki, et al., "A 0.2 μm contact filing by 450° C.–hydrazine–reduced TiN film with low resistivity", IEDM 92–979, pp. 11.8.1–11.8.3.

Suzuki, et al., "LPCVD–TiN Using Hydrazine and $TiCl_4$", VMIC Conference (Jun. 8–9, 1993), pp. 418–423.

IBM Tech. Disc. Bull. Knowledge–Based Dynamic Scheduler in Distributed Computer Control, (Jun. 1990), pp. 80–84.

IBM Tech. Disc. Bull. "Multiprocessor and Multitasking Architecture for Tool Control of the Advanced via Inspection Tools" (May 1992), pp. 190–191.

McGeachin, S., "Synthesis and properties of some β–diketimines derived from acetylacetone, and their metal complexes", Canadian J. of Chemistry, vol. 46 (1968), pp. 1903–1912.

Solanki, et al., "Atomic Layer deposition of Copper Seed Layers", Electrochemical and Solid State Letters, 3(10) (2000), pp. 479–480.

NERAC.COM Retro Search: Atomic Layer Deposition of Copper, dated Oct. 11, 2001.

NERAC.COM Retro Search: Atomic Layer Deposition/ Epitaxy Aluminum Oxide Plasma, dated Oct. 2, 2001.

NERAC Search abstract of "Plasma–Enhanced Atomic Layer deposition of Ta and Ti for Interconnect Diffusion Barriers", by Rossnagel, et al., J. Vac. Sci. & Tech., 18(4) (Jul. 2000).

NERAC.COM Retro Search: Abstracts of articles re Atomic Layer deposition, dated Oct. 16, 2001.

Bader, et al., "Integrated Processing Equipment", Solid State Technology, Cowan Pub., vol. 33, No. 5 (May 1, 1990), pp. 149–154.

Choi, et al., "The effect of annealing on resistivity of low pressure chemical vapor depositied titanium diboride", J. Appl. Phys. 69(11) (Jun. 1, 1991), pp. 7853–7861.

Choi, et al., "Stability of $TiB_2$ as a Diffusion Barrier on Silicon", J. Electrochem. Soc. 138(10) (Oct. 1991), pp. 3062–3067.

Maydan, Dan, "Cluster Tools for Fabrication of Advanced devices" Jap. J. of Applied Physics, Extended Abstracts, 22$^{nd}$ Conference Solid State Devices and Materials (1990), pp. 849–852 XP000178141.

Kitigawa, et al., "Hydrogen–mediated low temperature epitaxy of Si in plasma–enhanced chemical vapor deposition", Applied Surface Science (2000), pp. 30–34.

Lee, et al., "Pulsed nucleation for ultra–high aspect ration tungsten plugfill", Conference Proceedings ULSI XVII—2002, Materials Research Society, pp 649–654.

Rossnagel, S M., et al., "Plasma–enhanced atomic layer deposition of Ta and Ti for Interconnect diffusion barriers", J. Vac. Sci. Technol. B 18(4), Jul./Aug. 2000.

Partial Search Report (Annex to Form PCT/ISA/206), dated Oct. 25, 2002 for PCT/US02/02651.

International Search Report from the European Patent Office for International Application No. PCT/US 02/34553, dated May 8, 2002.

International Search Report from the European Patent Office for International Application No. PCT/US 02/34277, dated May 9, 2002.

Kukli, et al., "Properties of $(Nb_{1-x}Ta_x)_2O_5$ Solid Solutions and $(Nb_{1-x}Ta_x)_2O_5-ZrO_2$ Nanolaminates Grown by Atomic Layer Epitaxy," NanoStructured Materials, vol. 8, No. 7, 1997, p. 785–793.

Kukli, et al., "In–situ Study of Atomic Layer Epitaxy Growth of Tantalum Oxide Thin Films from $Ta(OC_2H_5)_5$ and $H_2O$," Applied Surface Science, Mar. 1997, p. 236–242.

Kukli, et al., "Properties of $Ta_2O_5$–based Dielectric Nanolaminates Deposited by Atomic Layer Epitaxy," J. Electrochem. Soc., vol. 144, No. 1 Jan. 1997, p. 300–306.

Kukli, et al. "Tailoring the Dielectric Properties of $HfO_2-Ta_2O_5$ Nanolaminates," Appl. Phys. Lett. 68 (26), Jun. 24, 1996, p. 3737–3739.

Kukli, et al. "Atomic Layer Epitaxy Growth of Tantalum Oxide Thin Films from $Ta(OC_2H_5)_5$ and $H_2O$," J. Electrochem. Soc., vol. 142, No. 5, May 1995 p. 1670–1675.

Ritala, M., et al. "Controlled Growth of TaN, $Ta_3N_5$, and $TaO_xN_y$ thin films by atomic layer deposition," Chem. Mater., vol. 11, No. 7, 1999 pp. 1712–1718.

Leskela, M., et al. "Atomic layer epitaxy in deposition of various oxide and nitride thin films," Colloque C5, supplement au Journal de Physique II, vol. 5, Jun. 1995 pp. 937–951.

Hiltunen, L., et al. "Nitrides of titanium, niobium, tantalum and molybdenum grown as thin films by the atomic layer epitaxy method," Thin Solid Films, 166 (1988) 149–154.

Klaus, et al. "Atomically Controlled Growth of Tungsten Nitride Using Sequential Surface Reactions," Applied Surface Science, 162–163 (2000) 479–491.

Yang, et al. "Atomic Layer Deposition of Tungsten Film from $WF_6/B_2H_5$: Nucleation Layer for Advanced Semiconductor Device," Conference Proceedings ULSI XVII (2002).

Eisenbraum, et al. "Atomic Layer Deposition (ALD) of Tantalum–based materials for zero thickness copper barrier applications," Proceedings of the IEEE 2001 International Interconnect Technology Conference (Cat. No. 01EX461) 2001.

Clark–Phelps, et al. "Engineered Tantalum Aluminate and Hafnium ALD Films for Ultrathin Dielectric Films with Improved Electrical and Thermal Properties," Mat. Res. Soc. Symp. Proc. vol. 670 (2001).

U.S. Appl. No. 09/388,989 (AMAT/3191.03) filed Sep. 2, 1999, Barney M. Cohen, et al., "Sequential Sputter and Reactive Precleans of Vias and contacts".

U.S. Appl. No. 10/871,864 (AMAT/7971), filed Jun. 18, 2004, Hua Chung, et al., "Atomic Layer Deposition of Barrier Materials".

U.S. Appl. No. 10/193,33 (AMAT/6303.P2) filed Jul. 10, 2002, Hua Chung, et al., "Integration of ALD Tantalum and alpha–phase Tantalum for Copper Metallization".

Derbyshire, Katherine; "Applications of integrated processing"; Solid State technology, Dec. 1994, pp. 45–48.

Ellwanger, R.C., "An Integrated Aluminum/CVD–W Metallization Process For Sub–Micron Contact Filing," Jun. 11–12, 1991, IEEE Catalog No. 91 TH0359–0, pp. 41–50.

PCT International Search Report dated May 30, 2003; Application No. PCT/US02/28715.

Applied. Phys. Lett. 71 (25), Dec. 22, 1997 (3604–6).

Chang–Wook, et al. "Growth and Characterization of Aluminum Oxide ($Al_2O_3$) Thin Films by Plasma–Assisted Atomic Layer Controlled Deposition," J. Korean Inst. Met. Mater., vol. 38, No. 10, Oct. 2000 pp. 1395–1399.

Chang–Wook, et al. "Plasma–assisted Atomic Layer Growth of High–Quality Aluminum Oxide Thin Films," Jpn. J. Appl. Phys. 1, vol. 40, No. 1, Jan. 2001 pp. 285–289.

Clark–Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).

Eisenbraum, et al. "Atomic Layer Deposition (ALD) of Tantalum–based materials for zero thickness copper barrier applications," Proceedings of the IEEE 2001 International Interconnect Technology Conference (Cat. No. 01EX461) 2001.

George, et al. "Atomic Layer Controlled Deposition of $SiO_2$ and $Al_2O_3$ using ABAB . . . binary reaction sequence chemistry," Applied Surface Science 82/83 (1994) 460–467.

George, et al. "Surface Chemistry for Atomic Layer Growth," J. Phys. Chem. 1996 100, 13121–13131.

Hwang, et al. "Nanometer–Size $\alpha$–$PbO_2$–type $TiO_2$ in Garnel: A Thermobarometer for Ultrahigh–Pressure Metamorphism," Science Vo. 288 (Apr. 14, 2000).

Juppo, et al. "Deposition of Copper Films by an Alternate Supply of CuCl and Zn," Journal of Vacuum Science & Technology, vol. 15, No. 4 (Jul. 1997), pp. 2330–2333.

Klaus, et al. "Atomic Layer Deposition of $SiO_2$ Using Catalyzed and Uncatalyzed Self–Limiting Surface Reactions," Surface Review and Letters, vol. 6, Nos. 3 & 4 (1999) 435–448.

Kukli, et al. "Atomic Layer Epitaxy Growth of Tantalum Oxide Thin Films from $Ta(OC_2H_5)_5$ and $H_2O$," Journal of the Electrochemical Society, vol. 142, No. 5, May 1995; p. 1670–1675.

Kukli, et al., "In situ Study of Atomic Layer Epitaxy Growth of Tantalum Oxide Thin Films From $Ta(OC_2H_5)_5$ and $H_2O$," Applied Surface Science, vol. 112, Mar. 1997, p. 236–242.

Kukli, et al., "Properties of $(Nb_{1-x}Ta_x)_2O_5$ Solid Solutions and $(Nb_{1-x}Ta_x)_2O_5-ZrO_2$ Nanolaminates Grown by Atomic Layer Epitaxy," 1997; p. 785–793.

Kukli, et al., "Properties of $Ta_2O_5$–Based Dielectric Nanolaminates Deposited by Atomic Layer Epitaxy," Journal of the Electrochemical Society, vol. 144, No. 1, Jan. 1997; p. 300–306.

Kukli et al., "Tailoring the Dielectric Properties of HfO$_2$–Ta$_2$O$_5$ Nanolaminates, Applied Physics Letters, vol. 68, No. 26, Jun. 24, 1996; p. 3737–3739 Layer Deposition," Chem. Vap. Deposition 1999, 5, No. 1.

Martensson, et al., "Atomic Layer Epitaxy of Copper Growth & Selectivity in the Cu(II)–2,2,6,6–tetramethyl–3–5heptanedionate H$_2$ Process," J. Electrochem. Soc., vol. 145, No. 8 (Aug. 1998), pp. 2926–2931.

Martensson, et al., "Atomic Layer Epitaxy of Copper and Tantalum," Chem. Vap. Deposition (1997) vol. 3, No. 1.

Martensson, et al. "Cu$_2$ as Copper Source in Atomic Layer Epitaxy," Chemical Vapor Deposition. Proceedings of the Fourteenth International Conference and EUROCVD–11 (1997), pp. 1529–36.

Martensson, et al. "Use of Atomic Layer Epitaxy for Fabrication of Si/TiN/Cu Structures," *Journal of Vacuum Science & Technology*, vol. 17, No. 5 (Sep. 1999), pp. 2122–2128.

McGeachin, "Synthesis and Properties of Some β–diketimines Derived from Acetylacetone, and Their Metal Complexes," Canadian Journal of Chemistry, vol. 46, (Jun. 1968) No. 11.

Min, et al. "Atomic Layer Deposition of TiN Thin Films by Sequential Introduction of Ti Precursor and NH3," Mat. Res. Soc. Symp. Proc. vol. 514 (1998).

Min, et al. "Chemical Vapor Deposition of Ti–Si–N Films With Alternating Source Supply," Mat. Rec. Soc. Symp. Proc. vol. (1999).

Min, et al., "Metal–organic Atomic–layer Deposition of Titanium–silicon–nitride films," Applied Physics Letters, vol. 75, No. 11 (Sep. 13, 1999).

Niinisto, et al. "Synthesis of Oxide Thin Films and Overlayers by Atomic Layer Epitaxy for Advanced Applications," Materials Science and Engineering B41 (1996) 23–29.

Paranjpe, et al. "Atomic Layer Deposition of AlO$_3$ for Thin Film Head Gap Applications," J. Elec. Soc., vol. 148, No. 9 Sep., 2001 pp. G465–G471.

Proceedings of the IEEE 1998 International Interconnect Technology Conference—San Francisco, California, Jun. 1–3, 1998.

Ritala, et al. "Atomic Force Microscopy Study of Titanium Dioxide Thin Films Grown by Atomic Layer Epitaxy," Thin Solid Films, vol. 228, No. 1–2 (May 15, 1993), pp. 32–35.

Ritala, et al. "Atomic Layer Deposition of Oxide Thin Films with Metal Alkoxides as Oxygen Sources," Science vol. 288 Apr. 14, 2000.

Ritala, et al. "Atomic Layer Epitaxy Growth of TiN Thin Films From TiI$_4$ and NH$_3$," J. Electrochem. Soc., vol. 145, No. 8 (Aug. 1998) pp. 2914–2920.

Ritala, et al. "Atomic Layer Epitaxy Growth of TiN Thin Films," J. Electrochem. Soc., vol. 142, No. 8, Aug. 1995.

Ritala, et al. "Effects of Intermediate Zinc Pulses on Properties of TiN and NbN Films by Atomic Layer Epitaxy," Applied Surface Science, vol. 120, No. 3–4, (Dec. 1997), pp. 199–212.

Ritala, et al. "Growth of Titanium Dioxide Thin Films by Atomic Layer Epitaxy," Thin Solid Films, vol. 225, No. 1–2 (Mar. 25, 1993) pp. 288–295.

Ritala, et al. "Perfectly Conformal TiN and Al$_2$ O$_3$ Films Deposited by Atomic Layer Deposition," Chem. Vap. Deposition 1999, 5, No. 1.

Ritala, et al. "Surface Roughness Reduction in Atomic Layer Epitaxy Growth of Titanium Dioxide Thin Films," Thin Solid–Films, vol. 249, No. 2 (Sep. 15, 1994), pp. 155–162.

Rossnagel, et al., "Plasma–enhanced Atomic Layer Deposition of Ta and Ti for Interconnect Diffusion Barriers", J. Vacuum. Sci. Tech. B., vol. 18, No. 4, (Jul. 2000), pp. 2016–2020.

Solanki, et al. "Atomic Layer Deposition of Copper Seed Layers," Electrochem. Solid–State Lett., vol. 3, No. 19 (2000), pp. 479–480.

Utriainen, et al. "Studies of Metallic Thin Film Growth in an Atomic Layer Epitaxy Reactor Using M(acac)$_2$(M=Ni,Cu, Pt) Precursors," Applied Surface Science, vol. 157, No. 3 (2000), pp. 151–158.

International Search Report for PCT/US02/28715 dated May 30, 2003 (AMAT/6303–PCT).

PCT Written Opinion for PCT/US02/28715 Dated Jul. 28, 2004 (AMAT/6303–PCT).

Hong, et al. "Characteristics of PAALD–TaN thin films derived from TAIMATA precursor for copper metallization", Internconnect Technology Conference, 2004. Proceedings of the IEEE 2004 International, Jun. 7–9, 2004, pp. 9–11.

International Search Report for International Application No. PCT/US2004/020008 dated Nov. 30, 2004 (AMAT/6303PC02).

Park, et al. "Performance improvement of MOSFET with HfO$_2$–Al$_2$O$_3$ laminate gate dielectric and CVD–TaN metal gate deposited by TAIMATA", Electron Devices Meeting, 2003. IEDM '03 Technical Digest. IEEE International Dec. 8–10, 2003, pp. 13.6.1–13.6.4.

Shenai, et al. "Correlation of vapor pressure equation and film properties with trimethylindium purity for the MOVPE grown III–V compounds," Journal of Crystal Growth 248 (2003) pp. 91–98.

INTEGRATION OF ALD TANTALUM NITRIDE FOR COPPER METALLIZATION

CROSS-REFERENCE TO RELATED APPLICATIONS

This application claims benefit of U.S. Provisional Patent application Ser. No. 60/478,663, filed Jun. 13, 2003, and titled, "Integration of ALD Tantalum Nitride for Copper Metallization." This application is a continuation in part of U.S. patent application Ser. No. 10/193,333, filed Jul. 10, 2002, which claims the benefit of U.S. Provisional Patent Application Ser. No. 60/346,086, filed on Oct. 26, 2001, and is a continuation-in-part of U.S. patent application Ser. No. 09/965,370, filed on Sep. 26, 2001, U.S. patent application Ser. No. 09/965,373, filed on Sep. 26, 2001 and U.S. patent application Ser. No. 09/965,369, filed on Sep. 26, 2001 now abandoned, which are incorporated by reference herein.

BACKGROUND OF THE INVENTION

1. Field of the Invention

Embodiments of the present invention relate to a method for manufacturing integrated circuit devices. More particularly, embodiments of the invention relate to a system and process of utilizing ALD tantalum nitride layer in the formation of metal interconnect structures.

2. Description of the Related Art

As the structure size of integrated circuit (IC) devices is scaled down to sub-quarter micron dimensions, electrical resistance and current densities have become an area for concern and improvement. Multilevel interconnect technology provides the conductive paths throughout an IC device, and are formed in high aspect ratio features including contacts, plugs, vias, lines, wires, and other features. A typical process for forming an interconnect on a substrate includes depositing one or more layers, etching at least one of the layer(s) to form one or more features, depositing a barrier layer in the feature(s) and depositing one or more layers to fill the feature. Typically, a feature is formed within a dielectric material disposed between a lower conductive layer and an upper conductive layer. The interconnect is formed within the feature to link the upper and lower conductive layers. Reliable formation of these interconnect features is important to the production of the circuits and the continued effort to increase circuit density and quality on individual substrates.

Copper is a choice metal for filling sub-micron high aspect ratio interconnect features because copper and its alloys have lower resistivities than aluminum. However, copper diffuses more readily into surrounding materials and can alter the electronic device characteristics of the adjacent layers. The diffused copper can form a conductive path between layers thereby reducing the reliability of the overall circuit and may even result in device failure. Hence, barrier layers are deposited prior to copper metallization to prevent or impede the diffusion of copper atoms. Barrier layers typically are refractory metals such as tungsten, titanium, tantalum, and nitrides thereof, which all have a greater resistivity than copper.

To deposit a barrier layer within a feature, the barrier layer is typically deposited on the bottom of the feature as well as the sidewalls thereof. Adequate deposition of the barrier layer on sidewalls typically results in excess deposition on the bottom. The excess amount of the barrier layer on the bottom of the feature not only increases the overall resistance of the feature, but also forms an obstruction between higher and lower metal interconnects of a multi-layered interconnect structure.

There is a need, therefore, for an improved method for forming metal interconnect structures which minimizes the electrical resistance of the interconnect.

SUMMARY OF THE INVENTION

One embodiment of the present invention provides a method of forming a metal interconnect on a semiconductor substrate, comprising cleaning features formed in a dielectric layer and exposing a conductive material underlying the dielectric layer by generating a plasma in a remote plasma source, delivering radicals from the plasma to a first process chamber which contains the substrate, and contacting the features formed in the dielectric layer with the radicals prior to a barrier layer deposition; depositing a tantalum nitride layer by atomic layer deposition within the features at a pressure between 1 and 10 Torr at a temperature between 200 and 300° C. in a second process chamber; depositing a tantalum layer by physical vapor deposition over the tantalum nitride layer in a third process chamber; plasma etching the tantalum layer and the tantalum nitride in a fourth process chamber to remove at least a portion of the tantalum layer and the tantalum nitride layer at the bottom of the feature to reveal the conductive material; optionally depositing additional tantalum or copper by physical vapor deposition on the tantalum layer; and depositing a seed layer over the conductive material and the tantalum layer in a fifth processing chamber, wherein the first processing chamber, the second processing chamber, the third processing chamber, the fourth processing chamber, and the fifth processing chamber are located in an integrated tool.

An apparatus for forming a metal interconnect on a semiconductor substrate, comprising a first processing chamber for cleaning features formed in a dielectric layer and exposing a conductive material underlying the dielectric layer by generating a plasma in a remote plasma source, delivering radicals from the plasma to the first process chamber which contains the substrate, and contacting the features formed in the dielectric layer prior to a barrier layer deposition; a second process chamber for depositing a tantalum nitride layer by atomic layer deposition within the features at a pressure between 1 and 10 Torr at a temperature between 200 and 300° C.; a third process chamber for depositing a tantalum layer by physical vapor deposition over the tantalum nitride layer; a fourth process chamber for plasma etching the tantalum layer and the tantalum nitride to remove at least a portion of the tantalum layer and the tantalum nitride layer at the bottom of the feature to reveal the conductive material and optionally depositing additional tantalum or copper by physical vapor deposition on the tantalum layer; and a fifth processing chamber for depositing a seed layer over the conductive material and the tantalum layer, wherein the first processing chamber, the second processing chamber, the third processing chamber, the fourth processing chamber, and the fifth processing chamber are located in an integrated tool.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Barrier Deposition Process

Figure 1:
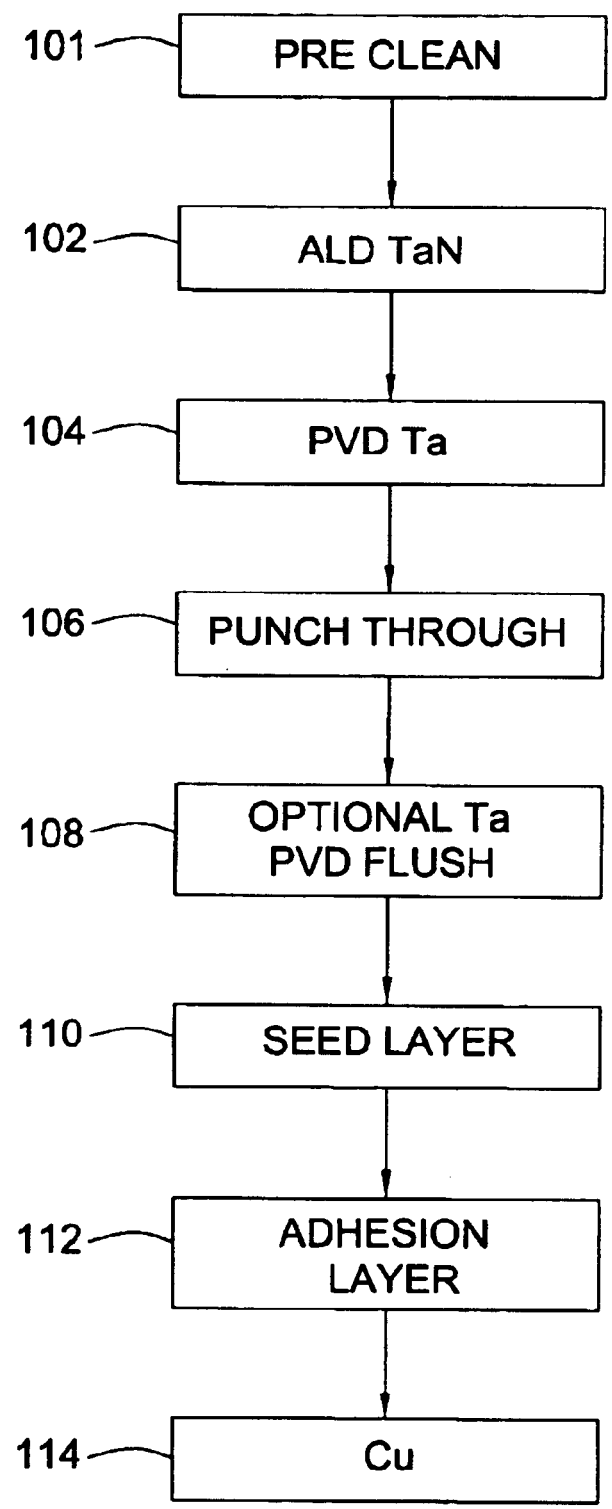
FIG. 1 illustrates one embodiment of a process of utilizing an ALD tantalum nitride layer in one stage in the formation of metal interconnect structures.

FIG. 1 illustrates one embodiment of a process of utilizing ALD tantalum nitride deposition in the formation of metal interconnect structures. In step 101, preconditioning occurs to prepare the surface for additional modification. The preconditioning options include nitrogen plasma, water plasma, hydrogen and helium plasma, low energy plasma, pre-flash with titanium or aluminum, or other precleaning process. In step 102, tantalum nitride is deposited by atomic layer deposition over a substrate structure. In step 104, a tantalum layer is deposited by physical vapor deposition over the tantalum nitride formed in step 102. In step 106, a punch-through step is performed to remove a portion of the tantalum nitride deposited in step 102 and to remove a portion of the tantalum deposited in step 104. In step 108, an optional titanium flash step may be performed to deposit tantalum by physical vapor deposition over the resulting substrate structure of step 106. In step 110, a seed layer is formed over the resulting substrate structure of step 106 or step 108. After step 110, an optional adhesion layer deposition step 112 or copper or other deposition step 114 may occur.

Deposition Apparatus

Figure 4:
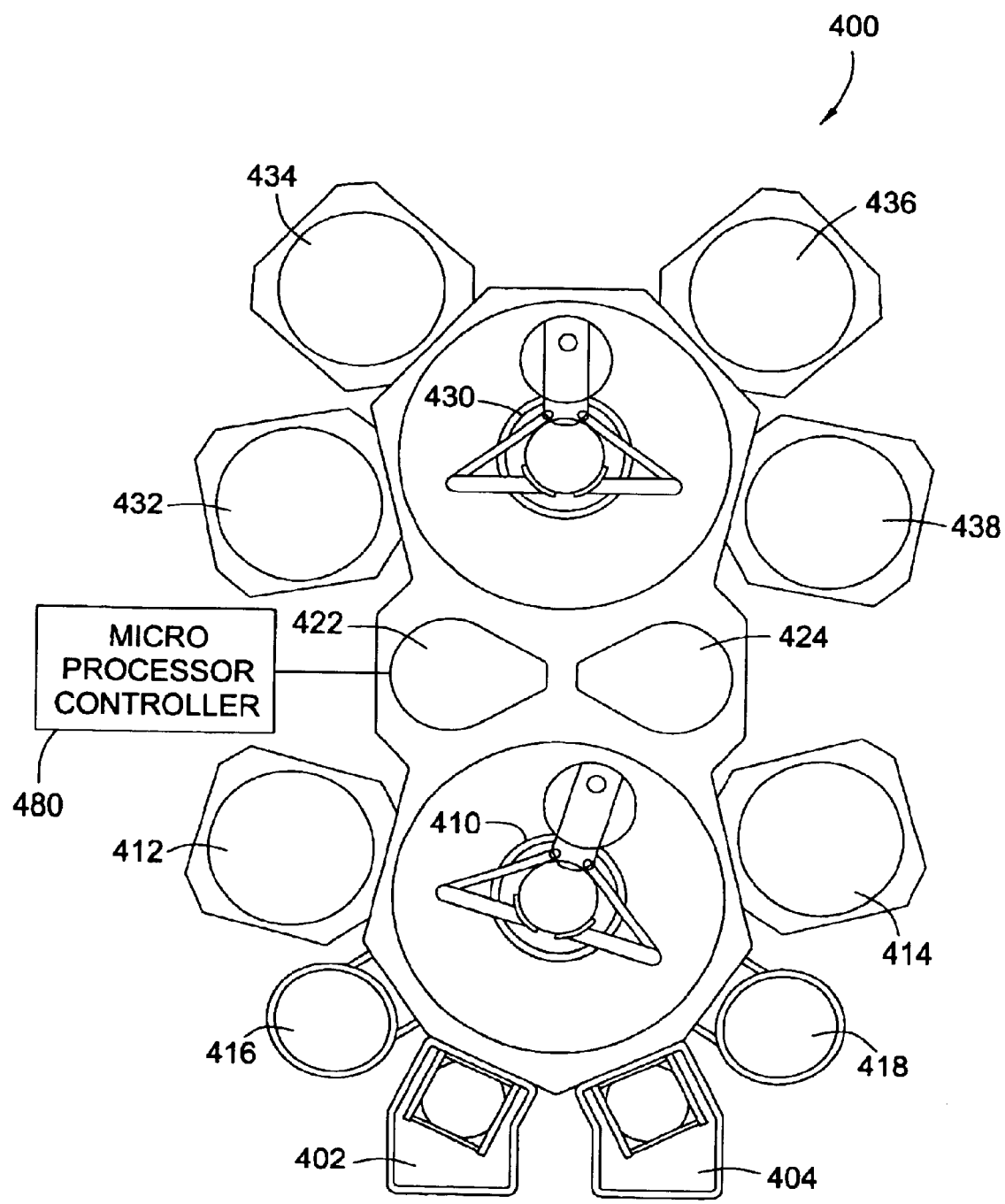
FIG. 4 illustrates a schematic plan view of an exemplary integrated cluster tool adaptable to perform the interconnect fabrication sequence described herein.

FIG. 4 is a schematic top-view diagram of an exemplary multi-chamber processing system 600 that may be adapted to perform processes as disclosed herein. Such a processing system 600 may be an Endura™ system, commercially available from Applied Materials, Inc., of Santa Clara, Calif. A similar multi-chamber processing system is disclosed in U.S. Pat. No. 5,186,718, entitled "Stage Vacuum Wafer Processing System and Method," issued on Feb. 16, 1993, which is incorporated by reference herein.

The system 400 generally includes load lock chambers 402 and 404 for the transfer of substrates into and out from the system 400. Typically, since the system 400 is under vacuum, the load lock chambers 402 and 404 may "pump down" the substrates introduced into the system 400. A first robot 410 may transfer the substrates between the load lock chambers 402 and 404 and a first set of one or more substrate processing chambers 412, 414, 416, and 418 (four are shown). Each processing chamber 412, 414, 416, and 418 can be outfitted to perform a number of substrate processing operations such as cyclical layer deposition including atomic layer deposition (ALD), chemical vapor deposition (CVD), physical vapor deposition (PVD), etch, pre-clean, de-gas, orientation and other substrate processes. The first robot 410 also transfers substrates to or from one or more transfer chambers 422 and 424.

The transfer chambers 422 and 424 are used to maintain ultrahigh vacuum conditions while allowing substrates to be transferred within the system 400. A second robot 430 may transfer the substrates between the transfer chambers 422 and 424 and a second set of one or more processing chambers 432, 434, 436, and 438. Similar to processing chambers 412, 414, 416, and 418, the processing chambers 432, 434, 436, and 438 can be outfitted to perform a variety of substrate processing operations, such as cyclical layer deposition including atomic layer deposition (ALD), chemical vapor deposition (CVD), physical vapor deposition (PVD), etch, pre-clean, degas, and orientation. Any of the substrate processing chambers 412, 414, 416, 418, 432, 434, 436, and 438 may be removed from the system 400 if not necessary for a particular process to be performed by the system 400.

Referring to FIG. 4, the processing system includes one or more atomic layer deposition (ALD) chambers configured to deposit barrier layers and one or more PVD chambers configured to deposit seed layers. To enhance efficiency and throughput of the system, one configuration of the processing system includes two ALD chambers configured to deposit barrier layers and two PVD chambers configured to deposit seed layers disposed in connection to the back-end central transfer chamber. In one configuration, the processing chambers 434 and 436 may be a tantalum nitride ALD chamber, processing chamber 432 and 438 may be a copper or tantalum PVD chamber.

In an additional configuration to perform the method of FIG. 1, processing chamber 434 may be a tantalum nitride atomic layer deposition chamber to perform step 102; processing chamber 432 may be a tantalum physical vapor deposition chamber to perform steps 104, 106, and 108; and processing chamber 412 may be a copper physical vapor deposition chamber to perform step 110 and possibly an etch step. In another example, chambers 436, 438, and 414 can mirror chambers 434, 432, and 412 respectively so that two sets of substrates may be processed in the integrated system.

These particular arrangements of the system 400 are provided to illustrate the invention and should not be used to limit the scope of the invention unless specifically set forth in the claims.

The Precleaning Process

The present invention provides a method for precleaning features on a semiconductor substrate to remove contaminants prior to metallization. The method includes removal of silicon dioxide from the bottom of contacts without damaging the silicon, removal of aluminum oxide or copper oxide from the bottom of vias without redeposition of the metal onto sidewalls, removal of a thin layer of silicon from the bottom of contact holes, and removal of contaminants from the sidewalls of the features.

The invention provides a suitable method for precleaning vias, contacts, and other features etched into a dielectric layer, such as a silicon dioxide layer, which is deposited on a conductive or semi-conductive sublayer, such as Ge, Si, Al, Cu, or TiN sublayers. The feature typically exposes the sublayer so that the feature can be filled with a conductive or semi-conductive material which connects the sublayer and a subsequent metal interconnect layer to be deposited on the dielectric layer. Etching of the features in the dielectric typically leaves contaminants which should be removed to improve filling of the features and ultimately improve the integrity and reliability of the devices formed.

After etching of the dielectric layer, the features can have damaged silicon or metal residues within the features from over-etching of the dielectric layer. The features can also contain residual photoresist on the feature surfaces from the photoresist stripping or ashing process or residual polymer from the dielectric etch step. The features may also contain redeposited material on the feature surfaces following a sputter etch preclean process. These contaminants can migrate into the dielectric layer or can interfere with the selectivity of metallization by promoting uneven distribution of the depositing metal. The presence of the contaminants also can increase the resistance of the deposited metal by substantially narrowing the width of the feature, creating a narrowed portion in the metal forming the via, contact line, or other conductive feature.

The precleaning method of the invention is especially useful for cleaning of submicron features having copper sublayers at the bottom of the features since copper is easily sputtered to the side walls in a conventional ICP or sputter etch based preclean chamber. The sputtered copper diffuses into the dielectric material causing device failure. The present invention cleans the via without sputtering of the base of the via.

Figure 5:
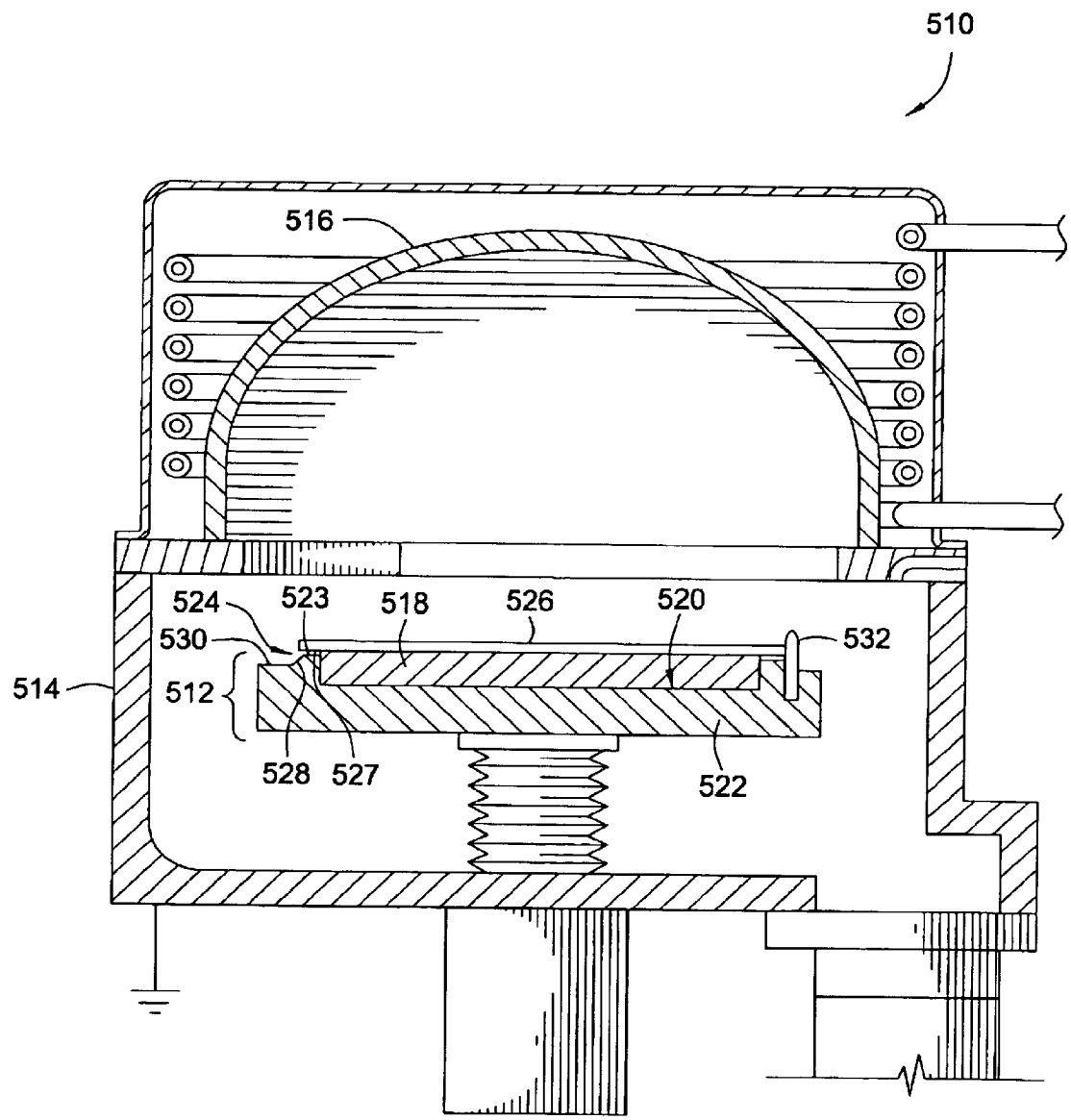
FIG. 5 illustrates a typical pre-clean chamber.

Referring to FIG. 5, the process for pre-cleaning the substrate 526 in the pre-clean chamber 510 may involve a reactive process or a sputter-etching process using the substrate 526 as the sputtering target. Generally, the reactive pre-clean process (step 101) may be performed on the substrate by introducing helium or a pre-clean gas mixture comprising hydrogen (less than about 10%) and helium into the chamber and providing RF power (between about 300 W and about 600 W at about 1 to 4 MHz) to a plasma generation coil. The substrate support may be biased between about 10 and 100 W. The chamber pressure may be maintained between about 40 mTorr and 200 mTorr during the pre-clean process. The reactive pre-clean process may be carried out for between about 30 seconds and 120 seconds. After the pre-clean process, the substrate is transferred to a chamber for deposition of a barrier layer and a seed layer over the surfaces of the substrate.

In one embodiment of the invention, the reactive pre-clean process (step 101) is performed on the substrate by introducing a pre-clean gas mixture comprising 5% hydrogen and 95% helium into the chamber and providing RF power to a coil at about 450 W at about 2.0 MHz. The substrate support is biased at about 1–200 W. The chamber pressure is maintained at about 80 mTorr during the pre-clean process. The reactive pre-clean process is carried out for about 60 seconds. After the pre-clean process, the substrate is transferred to a high density plasma physical vapor deposition chamber for deposition of a barrier layer and a seed layer over the surfaces of the substrate.

A Preferred Precleaning Apparatus

The precleaning process of the present invention is preferably conducted on a remote plasma source (RPS) chamber such as the Etch RPS chamber which is available from Applied Materials, Inc., Santa Clara, Calif. In a RPS chamber, reactive H radicals are formed by a remote plasma source and are introduced into the processing region as primarily neutral species, i.e., not having an electric charge and therefore not an ion, thereby preventing generation of self bias and bombardment of the wafer surface by ions. Experiments with RPS chambers show that a 2.45 GHz microwave source is more efficient and can generate more hydrogen radicals than lower frequency RF sources.

Barrier Layer Deposition

Figure 9A:
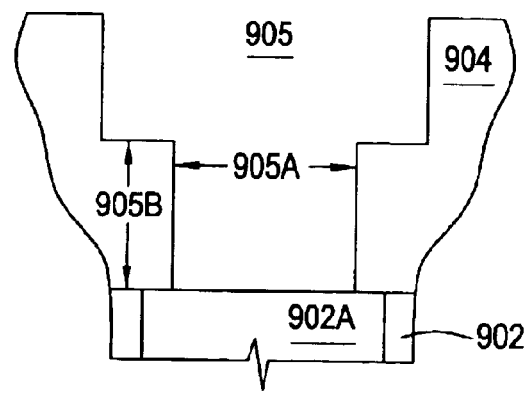
FIGS. 9A–9F are schematic representations of an exemplary substrate structure at various stages in the process of FIG. 1.

"Atomic layer deposition" as used herein refers to the sequential introduction of two or more compounds to deposit a thin layer on a substrate surface. The two or more compounds are sequentially introduced into a reaction zone of a processing chamber. Each compound is separated by a time delay or pause to allow each compound to adhere to or react on the substrate surface. In one aspect, a first compound, compound A, is dosed/pulsed into the reaction zone followed by a first time delay or pause. Next, a second compound or compound B is dosed/pulsed into the reaction zone followed by a second time delay. These sequential tandems of a pulse of reactive compound followed by a time delay may be repeated indefinitely until a desired film or film thickness is formed on the substrate surface FIGS. 9A–9F are schematic representations of an exemplary substrate structure at various stages in the process of FIG. 1. FIG. 9A shows a dielectric layer 904 formed over one or more underlying layers 902. The dielectric layer 904 may be any dielectric material including a low k dielectric material (k<4.0), whether presently known or yet to be discovered. For example, the dielectric layer 904 may be a silicon oxide or a carbon doped silicon oxide material. The dielectric layer has been patterned and etched to form an aperture 905 using conventional and well-known techniques. The aperture 905 may be used to form a plug, via, contact, line, wore, or any other interconnect component. As shown in FIG. 2A, the aperture 905 may be used to form an interconnect component in a dual damascene structure. The processes as disclosed herein may be used to particular advantage over an aperture 905 have a lower opening size 905A of about 0.22 μm or less and having a lower aspect ratio 905B of about 4:1 or greater, such as about 6:1.

The aperture 905 exposes at least a conductive portion 902A of a part of a lower level metal interconnect feature, such as a plug, via, contact, line, wire, metal gate electrode, etc. The conductive portion 902A may comprise any conductive material, such as aluminum, copper, tungsten, or combinations. The process as disclosed herein may be performed to advantage over a conductive portion 902A comprising copper, which will be discussed herein in greater detail.

Figure 9B:
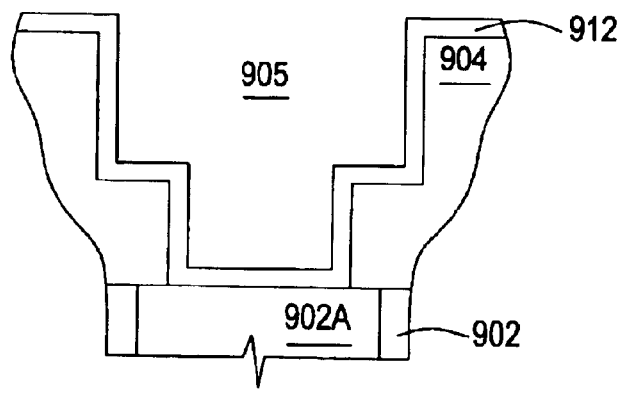

FIG. 9B shows a tantalum nitride layer 912 conformally deposited by atomic layer deposition, such as after step 102.

The tantalum nitride layer is deposited to a thickness of about 50 Å or less, preferably between about 5 Å and about 20 Å. One of the advantages of atomic layer deposition over other conventional deposition techniques such as physical vapor deposition and chemical vapor deposition for tantalum nitride is the ability to deposit a conformal layer of tantalum nitride over the small openings, high aspect ratio, and varied topography of apertures, such as aperture 905, in the formation of interconnect structures. The heater temperature of the substrate support is maintained at a low temperature between about 100° C. and 300° C. In one aspect, it is believed that the low deposition temperature helps provide a more conformal tantalum nitride layer. Another of the advantages of the formation of an ALD tantalum nitride layer 912 over dielectric layer 904 is the good adhesion of the ALD tantalum nitride over dielectric materials.

The tantalum nitride layer deposited according to atomic layer deposition methods described herein shows evidence of an epitaxial growth phenomenon. In other words, the barrier layer takes on the same or substantially the same crystallographic characteristics as the underlying layer. As a result, a substantially single crystal is grown such that there is no void formation at an interface between the tantalum nitride layer and the underlying layer. Likewise, an additional tantalum layer deposited over the tantalum nitride layer exhibits the same or substantially the same epitaxial growth characteristics that continue the formation of the single crystal. Accordingly, no void formation is produced at this interface. The resulting structure resembling a single crystal eliminates void formation, thereby substantially increasing device reliability. The single crystal structure also reduces the overall resistance of the interconnect feature while still providing excellent barrier properties. Furthermore, it is believed that the single crystalline growth reduces the susceptibility of electromigration and stress migration due to the conformal and uniform crystalline orientation across the interconnect material interfaces.

Tantalum nitride may be deposited by atomic layer deposition by providing one or more pulses of a tantalum-containing compound at a flow rate between about 100 sccm and about 3,000 sccm for a time period of about 1.0 second or less and one or more pulses of a nitrogen-containing compound at a flow rate between about 100 sccm and about 3,000 sccm for a time period of about 1.0 second or less to a reaction zone having a substrate disposed therein.

Exemplary tantalum-containing compounds include: t-butylimino-tris(diethylamino)tantalum (TBTDET); pentakis(ethylmethylamino)tantalum (PEMAT); pentakis(dimethylamino)tantalum (PDMAT); pentakis(diethylamino)tantalum (PDEAT); t-butyliminotrislethylmethylamino) tantalum(TBTMET); t-butylimino-tris(dimethylamino)tantalum (TBTDMT); bis(cyclopentadienyl)tantalum trihydride ((Cp)$_2$TaH$_3$); bis(methylcyclopentadienyl) tantalum trihydride ((CpMe)$_2$TaH$_3$); derivatives thereof; and combinations thereof. Preferably, the tantalum-containing compound comprises PDMAT. Exemplary nitrogen-containing compounds include: ammonia; hydrazine; methylhydrazine; dimethylhydrazine; t-butylhydrazine; phenylhydrazine; azoisobutane; ethylazide; derivatives thereof; and combinations thereof. Preferably, the nitrogen-containing compound comprises ammonia.

It is to be understood that these compounds or any other compound not listed above may be a solid, liquid, or gas at room temperature. For example, PDMAT is a solid at room temperature and TBTDET is a liquid at room temperature. Accordingly, the non-gas phase precursors are subjected to a sublimation or vaporization step, which are both well known in the art, prior to introduction into the processing chamber. A carrier gas, such as argon, helium, nitrogen, hydrogen, or a mixture thereof, may also be used to help deliver the compound into the processing chamber, as is commonly known in the art.

In a particular embodiment, a tantalum nitride layer is formed by atomic layer deposition by cyclically introducing PDMAT and ammonia to the substrate surface. To initiate the deposition of the tantalum nitride layer, a carrier/inert gas such as argon is introduced into the processing chamber 600 to stabilize the pressure and temperature therein. The carrier gas is allowed to flow continuously during the deposition process such that only the argon flows between pulses of each compound. A first pulse of PDMAT is provided from the gas source 613 at a flow rate between about 400 sccm and about 1000 sccm, with a pulse time of about 2.0 seconds or less after the chamber temperature and pressure have been stabilized at about 200° C. to about 300° and about 1 Torr to about 5 Torr. A pulse of ammonia is then provided at a flow rate between about 500 sccm and about 3000 sccm, with a pulse time of about 2.0 seconds or less.

A pause between pulses of PDMAT and ammonia is about 1.0 second or less, preferably about 0.5 seconds or less, more preferably about 0.1 seconds or less. In various aspects, a reduction in time between pulses at least provides higher throughput. As a result, a pause after the pulse of ammonia is also about 1.0 second or less, about 0.5 seconds or less, or about 0.1 seconds or less. Argon gas flowing between about 1,000 sccm and about 10,000 sccm, such as between about 3,000 sccm and about 6,000 sccm, is continuously provided. In one aspect, a pulse of PDMAT may still be in the chamber when a pulse of ammonia enters. In general, the duration of the carrier gas and pump evacuation should be long enough to prevent the pulses of PDMAT and ammonia from mixing together in the reaction zone.

The heater temperature is maintained between about 100° C. and about 300° C. at a chamber pressure between about 1.0 and about 5.0 Torr. Each cycle consisting of a pulse of PDMAT, pause, pulse of ammonia, and pause provides a tantalum nitride layer having a thickness between about 0.3 Å and about 1.0 Å per cycle. The alternating sequence may be repeated until the desired thickness is achieved.

A "pulse/dose" as used herein is intended to refer to a quantity of a particular compound that is intermittently or non-continuously introduced into a reaction zone of a processing chamber. The quantity of a particular compound within each pulse may vary over time, depending on the duration of the pulse. A particular compound may include a single compound or a combination of two or more compounds. The durations for each pulse/dose are variable and may be adjusted to accommodate, for example, the volume capacity of the processing chamber as well as the capabilities of a vacuum system coupled thereto. Additionally, the dose time of a compound may vary according to the flow rate of the compound, the pressure of the compound, the temperature of the compound, the type of dosing valve, the type of control system employed, as well as the ability of the compound to adsorb onto the substrate surface. Dose times may also vary based upon the type of layer being formed and the geometry of the device being formed. Typically, the duration for each pulse/dose or "dose time" is typically about 1.0 second or less. However, a dose time can range from microseconds to milliseconds to seconds, and even to minutes. In general, a dose time should be long enough to provide a volume of compound sufficient to adsorb or chemisorb onto the entire surface of the substrate and form a layer of the compound thereon.

A Preferred Atomic Layer Deposition Apparatus

Figure 6:
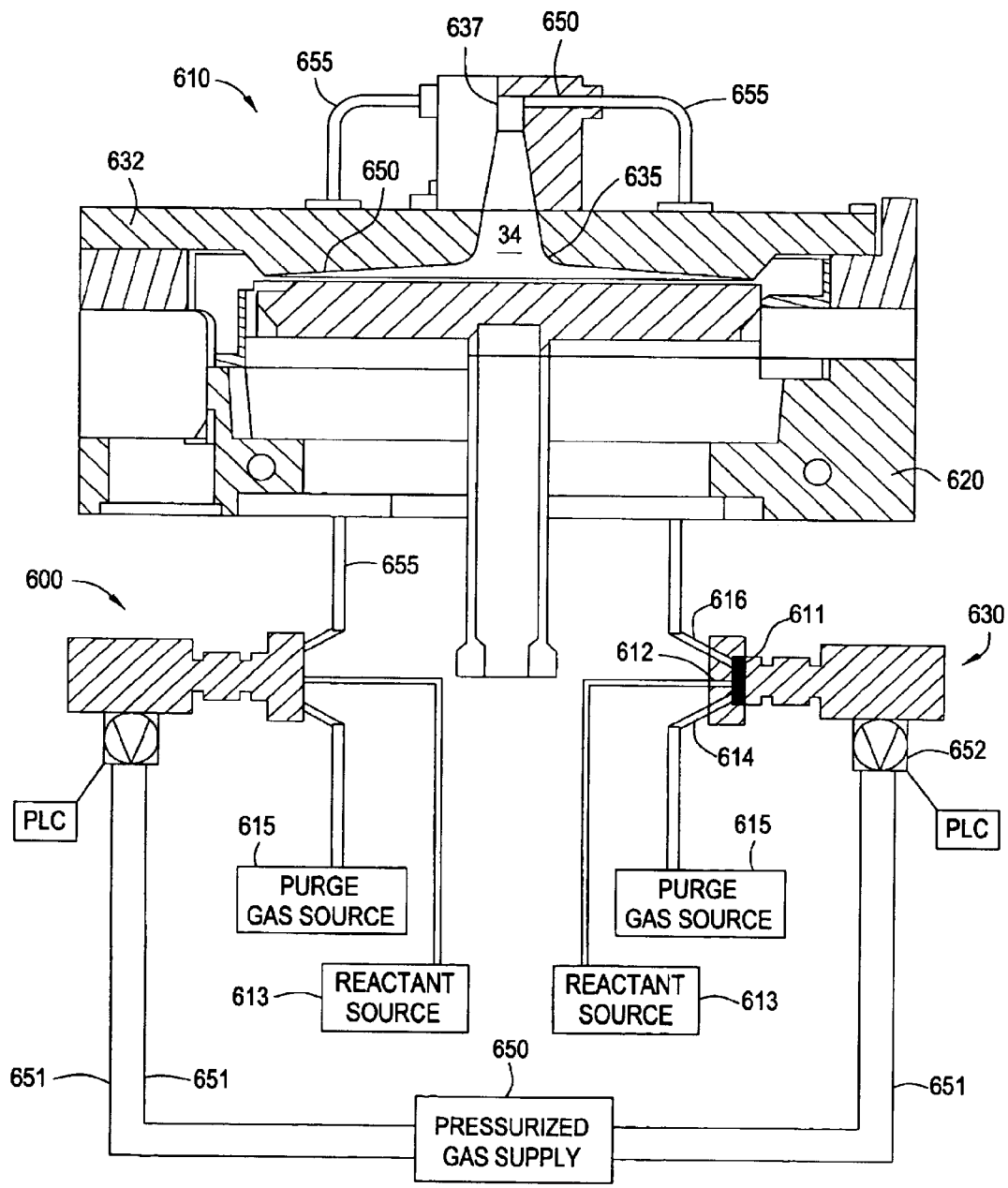
FIG. 6 illustrates a schematic, partial cross section of an exemplary processing chamber for forming a thin barrier layer according to a cyclical deposition technique.
Figure 7:
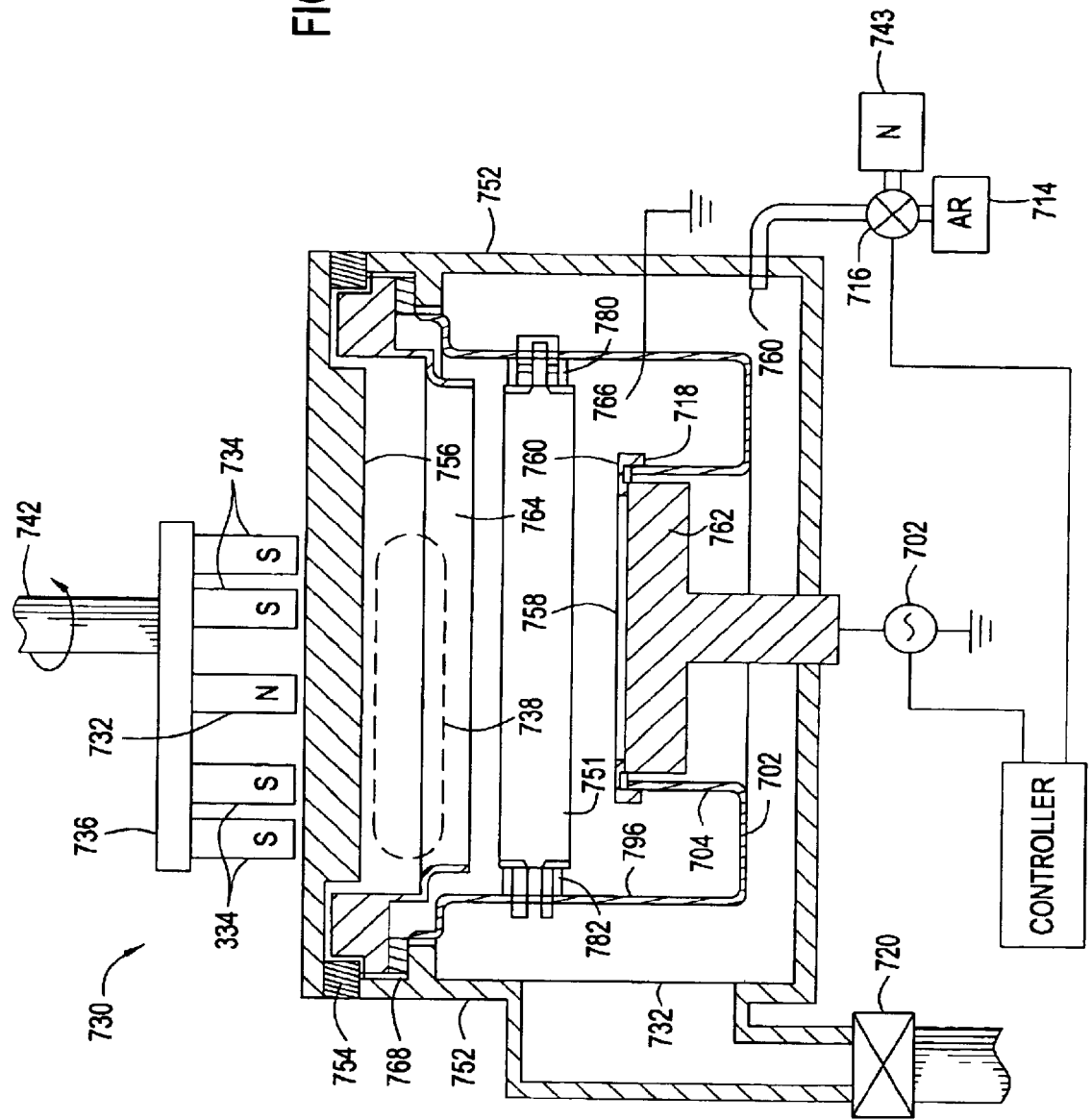
FIG. 7 illustrates a schematic, partial cross section of an exemeplary processing chamber for forming a thin metal layer according to a physical vapor deposition technique.
Figure 8:
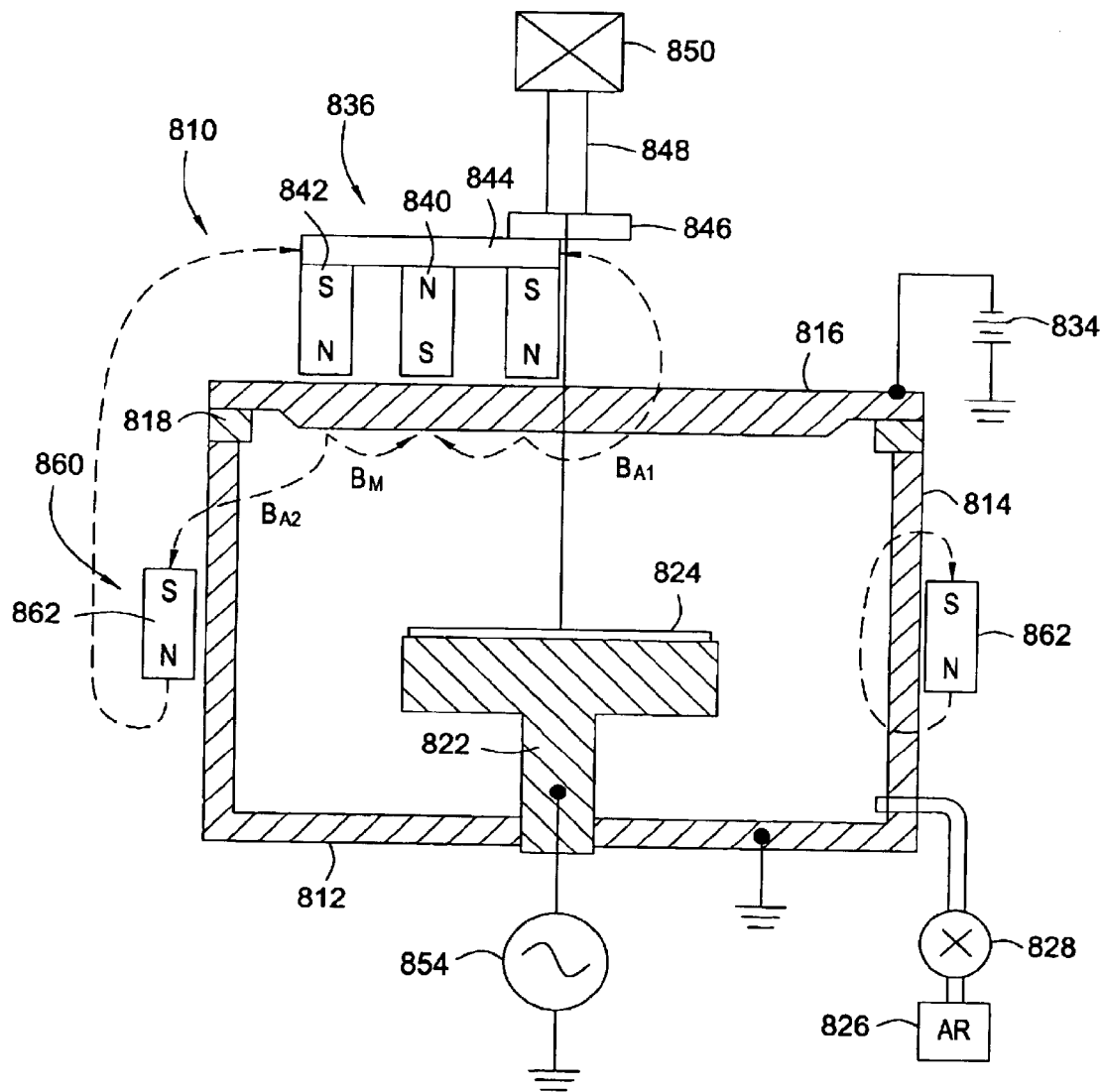
FIG. 8 illustrates a schematic, partial cross section of an exemplary processing chamber for forming a thin seed layer or adhesion layer.

FIG. 6 illustrates a schematic, partial cross section of an exemplary processing chamber 600 for forming a barrier layer according to embodiments of the present invention. Such a processing chamber 600 is available from Applied Materials, Inc. located in Santa Clara, Calif., and a brief description thereof follows. A more detailed description may be found in commonly assigned U.S. patent application Ser. No. 10/032,284, entitled "Gas Delivery Apparatus and Method For Atomic Layer Deposition", filed on Dec. 21, 2001, which is incorporated herein by reference to the extent not inconsistent with the claimed aspects and disclosure herein.

The processing chamber 600 may be integrated into an integrated processing platform, such as an Endura™ platform also available from Applied Materials, Inc. Details of the Endura™ platform are described in commonly assigned U.S. patent application Ser. No. 09/451,628, entitled "Integrated Modular Processing Platform", filed on Nov. 30, 1999, which is incorporated herein by reference to the extent not inconsistent with the claimed aspects and disclosure herein.

FIG. 6 is a schematic cross-sectional view of one embodiment of a substrate processing chamber 610 including one or more valve assemblies 600 mounted below a chamber body 620 of the substrate processing chamber 610. The valve assemblies 600 are coupled to gas lines 655 plumbed through the chamber body 620. The gas lines 655 are, in turn, coupled to gas conduits 650 to provide one or more gases into the chamber body 620. The valve assemblies may also be mounted to other substrate processing chambers and may be mounted to other chamber components.

Referring to FIG. 6, each valve assembly 600 includes a valve body 610 and a diaphragm assembly 630. The valve body 610 includes a valve chamber 611 in fluid communication with three ports including a reactant inlet 612, a purge inlet 614, and an outlet 616. The reactant inlet 612 is in fluid communication with a reactant source 613 to supply a reactant through the valve chamber 611, through the outlet 616, through the gas line 655, through the gas conduit 650, and into the chamber body 620. The purge inlet 614 is in fluid communication with a purge gas source 615 and is adapted to supply a purge gas through the valve chamber 611, through the outlet 616, through the gas line 655, through the gas conduit 650, and into the chamber body 620. If the substrate processing chamber 610 includes two or more valve assemblies 600, the purge inlet 614 of each valve assembly 600 is preferably coupled to separate purge gas sources 615. In other embodiments, the purge inlet 614 of each valve assembly 600 may be coupled to a common purge gas source.

Referring to FIG. 6, an electronically controlled valve 652, such as a solenoid valve, may be mounted to the diaphragm assembly 630 to selectively provide a pressurized gas from a pressurized gas supply 650, such as air or other gas, coupled to the electronically controlled valve 652 through a gas line 651. Programmable logic controllers (PLC) are coupled to the electronically controlled valves 652 to control electrical signals to the electronically controlled valve 652. The programmable logic controllers are in turn coupled to a main controller which controls the programmable logic controller. Although an electronically controlled valve provides pressurized gas to the diaphragm assembly 630, the valve assembly 600 is a pneumatically actuated valve.

In one embodiment, argon is used as the carrier gas at a flow rate 500 sccm, ammonia enters the chamber at a flow rate of 1500 sccm, and the argon purge flow is at a flow rate 8000 sccm.

Post-Deposition Treatment Options

After the dielectric deposition, the substrate may be treated with a plasma, seed layer deposition, or adhesion layer deposition before the bulk metal deposition step. The plasma treatment may comprise argon, nitrogen, or hydrogen plasma. The seed layer deposition may comprise copper, copper aluminum, copper tin, tantalum, tungsten, thallium, cobalt, titanium, aluminum, another metal, or combinations of metals. Methods of deposition include ALD, CVD, PVD, electroplating or electroless plating. The adhesion layer may comprise rubidium, tantalum, titanium, aluminum, or tungsten.

Optional Tantalum Layer

Figure 9C:
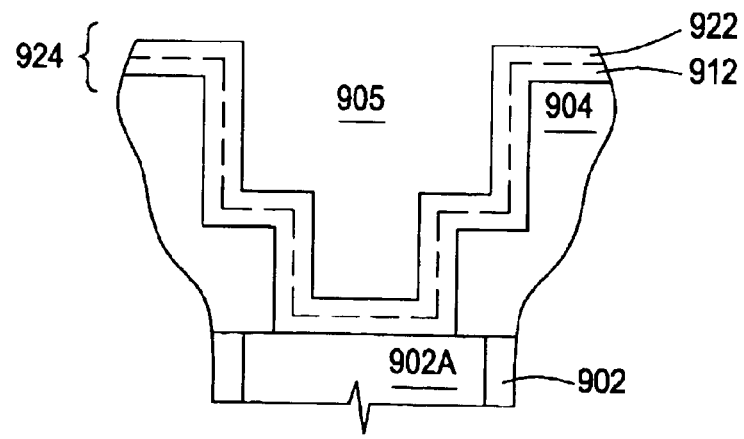

FIG. 9C shows a tantalum layer 922 deposited over the tantalum nitride layer 912, such as after step 104. The tantalum layer 922 and the tantalum nitride layer 912 together make up barrier layer 924. In one aspect, the tantalum layer 922 provides good adhesion with the seed layer 942 (FIG. 9F). In another aspect tantalum nitride 912 and tantalum 922 have good adhesion with each other. In one embodiment, the temperature of the substrate support is unheated (i.e. room temperature). In one embodiment, a RF substrate bias of between about 100 Watts and about 1000 Watts may be provided to the substrate support during deposition of the tantalum layer 922. The DC power supplied to the ALD deposition may be 40 kW with an RF power of 2 kW. The tantalum layer is deposited to a thickness of about 75 Å or less, preferably between about 40 Å and about 60 Å.

Not wishing to be bound by theory unless explicitly set forth in the claims, it is believed that the conformal ALD tantalum nitride layer 912 helps cause growth of low resistivity alpha-phase tantalum at least over portions thereover, such as on the bottom of the aperture or over field areas, during physical vapor deposition. It is also believed that the wafer bias during physical vapor deposition helps in the formation of low resistivity alpha-phase tantalum

Punch-Through

Figure 9D:
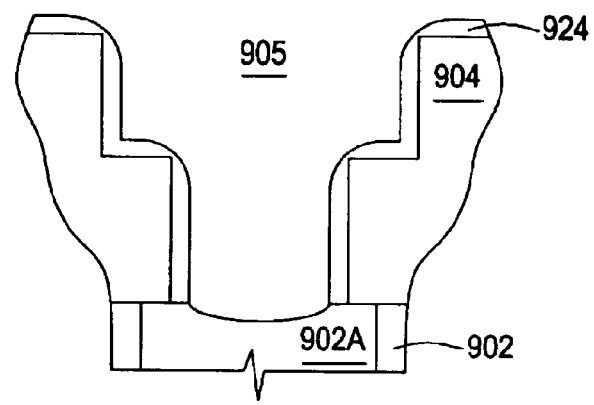

FIG. 9D shows a punch through step performed to remove at least a portion of tantalum nitride and tantalum at the bottom of the aperture 905. Preferably, etch step is performed to remove tantalum nitride and tantalum at the bottom of the aperture 905 to reveal conductive portion 902A of the underlying layer 902. In one aspect, the tantalum nitride and tantalum remaining at the sidewalls prevent copper diffusion of the sputtered conductive material, such as copper, from a conductive portion 902A, such as a copper conductive portion, into the dielectric layer 904. The punch-through step also removes an oxide formation, residues (such as patterning residues), and other contaminants which may have formed over the conductive portion 902A.

The etch preferably comprises an argon plasma etch. A directional argon plasma etch is used to ensure that the plasma etch will reach the bottom of the aperture 905. The conditions for the etch are dependent on the design parameters of the chamber and the substrate support. RF wafer bias is between about 100 Watts and about 1000 Watts and is performed for a time period of between about 1 second and about 20 seconds depending on the desired thickness of the tantalum nitride and tantalum to be removed.

In one embodiment, the DC power supplied to the system is 0 W. The The RF power is 2000 W, the DC coil has a power of 800 W, and the wafer bias is 600 W. Argon is used as the carrier gas.

Optional Tantalum Flash

Figure 9E:
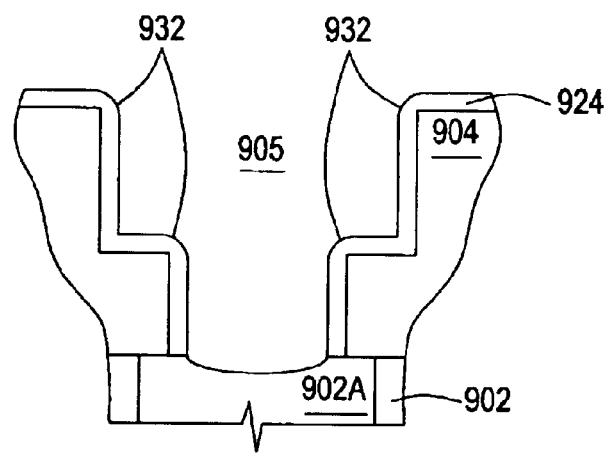
Figure 9F:
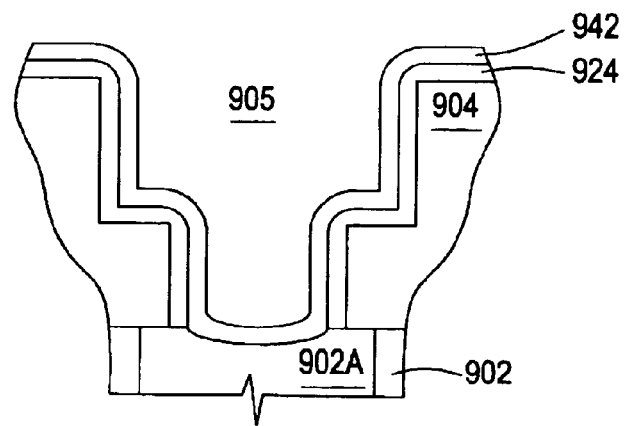

FIG. 9E shows an optional tantalum physical vapor deposition flash step. It is intended that the tantalum physical vapor deposition flash step deposits tantalum at the bevel corners 932 to help build up tantalum at the bevel corners 932 which may have been etched during the punch-through step. The tantalum flash step is preferably performed with a low wafer bias to reduce tantalum deposition at the bottom of the aperture 905.

Optional Seed Layer

FIG. 9F shows a seed layer 942 deposited over the substrate structure of FIG. 9D or FIG. 9E. The seed layer 942 may comprise a copper seed layer, a copper alloy seed layer, another metal seed layer, and combinations thereof. Preferably, the seed layer 942 comprises a copper seed layer, a copper alloy seed layer, or combinations thereof Because the punch-through step reduces or removes the thickness of tantalum nitride layer 912 and tantalum layer 922 at the bottom of the aperture 905, the resistance of the interconnect structure is reduced. In one embodiment, a copper-to-copper interface may be provided between the seed layer 942 comprising copper and a conductive portion 902A comprising copper. In addition, because the punch-through step reduces or removes the tantalum nitride layer 912 and tantalum layer 922 at the bottom of the aperture 905 a thicker tantalum nitride layer 912 may be initially deposited. For these reasons and other reasons discussed herein, device performance and reliability are improved.

Referring to FIG. 1, physical vapor deposition of tantalum of step 104 is performed in a PVD chamber, such as an ionized metal plasma (IMP) PVD chamber. Examples of IMP PVD chambers include a Self-Ionized Plasma 51pTM chamber or an EnCoReTM Ta chamber, available from Applied Materials, Inc. of Santa Clara, Calif. The punch-through step 106 may be performed in a suitable plasma-processing chamber. The tantalum physical vapor deposition step 108 may be performed in a suitable PVD chamber. For through-put and particle generation concerns, steps 104–108 are preferably performed in the same processing chamber.

Continuing to refer to FIG. 1, a seed layer is at least partially deposited on the barrier layer, as shown at step 110. The seed layer may be deposited using any conventional deposition technique, such as chemical vapor deposition (CVD), physical vapor deposition (PVD), electroplating, or electroless plating. For example, the seed layer may be deposited in an IMP PVD chamber. In one aspect, the seed layer is a conventional copper seed layer. In another aspect, the seed layer is a copper alloy seed layer. In still another aspect, the seed layer is a multi-layer seed layer of the same or different metals and alloys.

Alternative Embodiment

Figure 2:
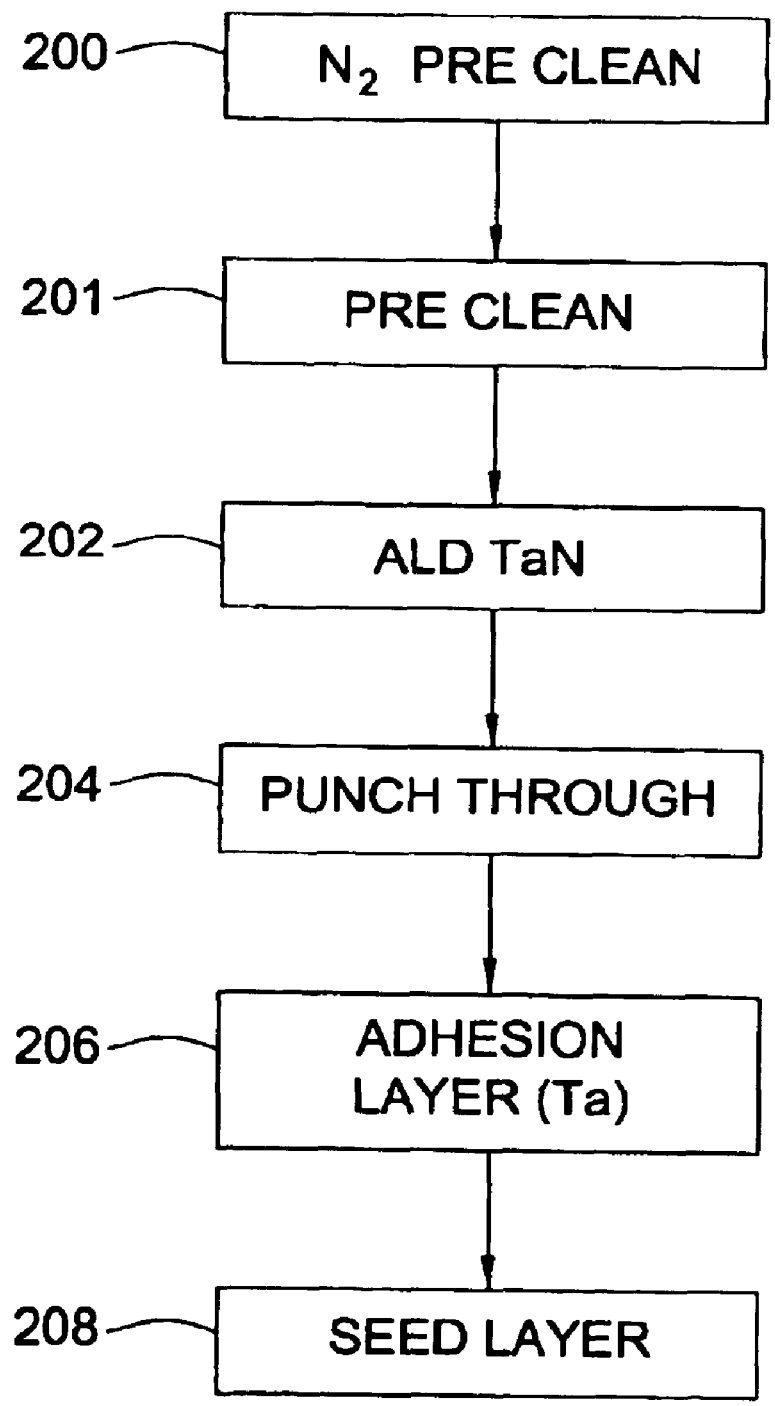
FIG. 2 illustrates another embodiment of a process utilizing an ALD tantalum nitride layer in one stage in the formation of metal interconnect structures.

FIG. 2 illustrates another embodiment of a process of utilizing ALD tantalum layer in one stage in the formation of metal interconnect structures. In step 202, tantalum nitride is deposited by atomic layer deposition over a substrate structure. In step 204, a punch-through step is performed to remove a portion of the tantalum nitride deposited in step 202. In step 206, an adhesion layer, such as a tantalum layer or a suitable metal, is deposited over the resulting substrate structure of step 204. In step 208, a seed layer is formed over the adhesion layer. All or a partial number of steps 202 through 208 may be performed on an integrated processing system, such as the system of FIG. 4.

Figure 10:
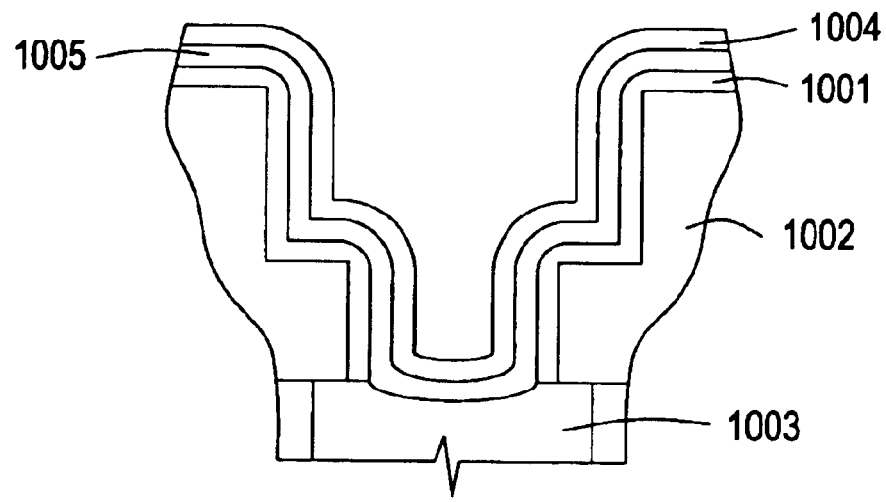
FIG. 10 is a schematic representation of an exemplary substrate structure at a stage in the process of FIG. 2.

FIG. 10 is a schematic representation of an example of a resulting substrate structure after step 208 of FIG. 2. In one aspect, the tantalum nitride layer 1001 is deposited in step 202 to a thickness of about 50 Å or less, preferably between about 5 Å and about 30 Å. The tantalum nitride layer 1001 protects the sidewalls of the dielectric layer 1002 from sputter conductive material 1004, such as copper, from a conductive portion of an underlying layer 1003 below the dielectric layer 1002. The punch-through step is performed for preferably about 10 seconds or less. One advantage of the present process is that the punch-through step need only remove a portion of the tantalum nitride in order to expose a conductive portion of the underlying layer.

Additional Alternative Embodiment

Figure 3A:
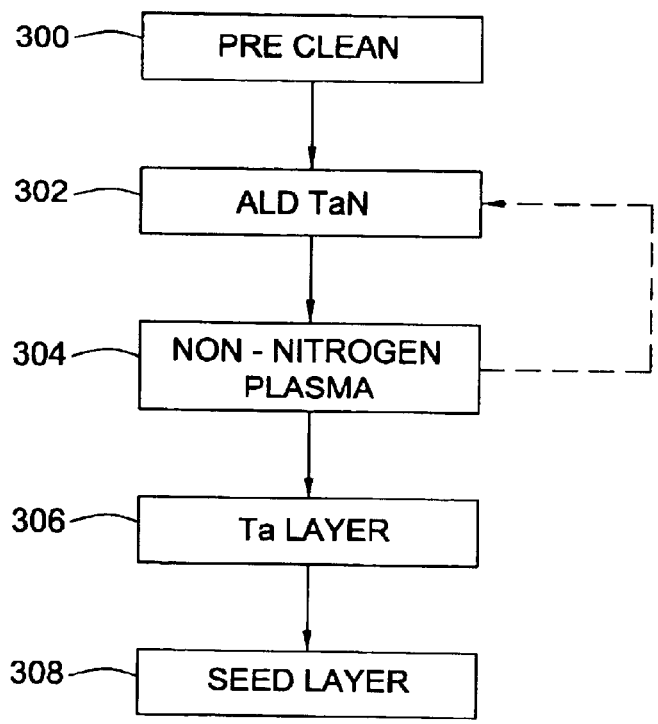
FIG. 3A illustrates yet another embodiment of a process utilizing an ALD tantalum nitride layer in one stage in the formation of metal interconnect structures.

FIG. 3A illustrates yet another embodiment of a process of utilizing ALD tantalum nitride layer in one stage in the formation of metal interconnect structures. In step 302, tantalum nitride is deposited by atomic layer deposition over a substrate structure. In step 304, the tantalum nitride layer is exposed to a non-nitrogen plasma. Preferably, the non-nitrogen plasma comprises a noble gas, such as argon. The non-nitrogen plasma may further include hydrogen or other non-nitrogen gases. Optionally, steps 302 and 304 may be repeated. For example, a non-nitrogen plasma treatment may be performed after a number cycles, for example after every 20 cycles, until a desired amount of tantalum nitride has been deposited. Multiple non-nitrogen plasma treatments help to treat the tantalum nitride at the bottom of the aperture. In step 306, an optional tantalum layer may be deposited over the plasma-treated tantalum nitride layer. In step 308, a seed layer is formed over the resultant substrate structure of step 304 or 306. All or a partial number of steps 302 through 308 may be performed on an integrated processing system, such as the system of FIG. 4.

Figure 11:
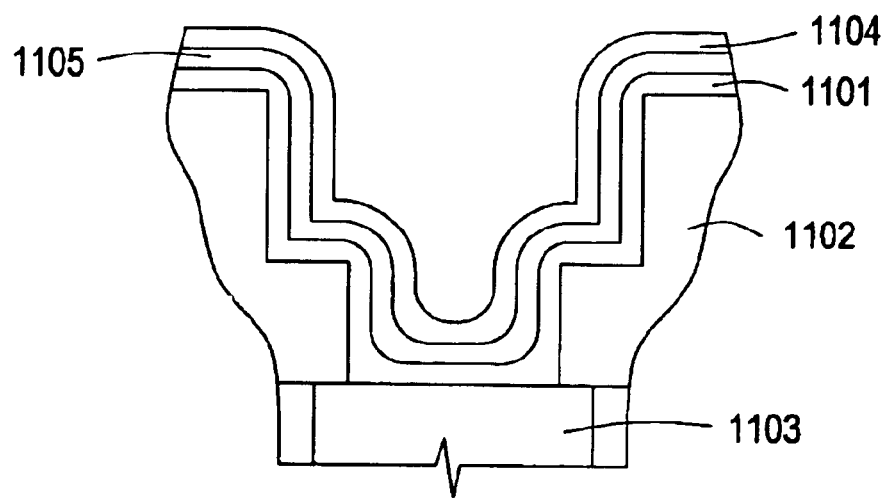
FIG. 11 is a schematic representation of an exemplary substrate structure at a stage in the process of FIG. 3A.

FIG. 11 is a schematic representation of an example of a resulting substrate structure after step 308 of FIG. 3A. In one aspect, it is believed that the non-nitrogen plasma treatment reduces the nitrogen content of the ALD tantalum nitride layer 1101. Since the nitrogen content of the ALD tantalum nitride layer 1101 is reduced, the resistivity of thereof is reduced and thus the contact resistance is reduced.

Multiple ALD TaN Deposition Steps

Figure 3B:
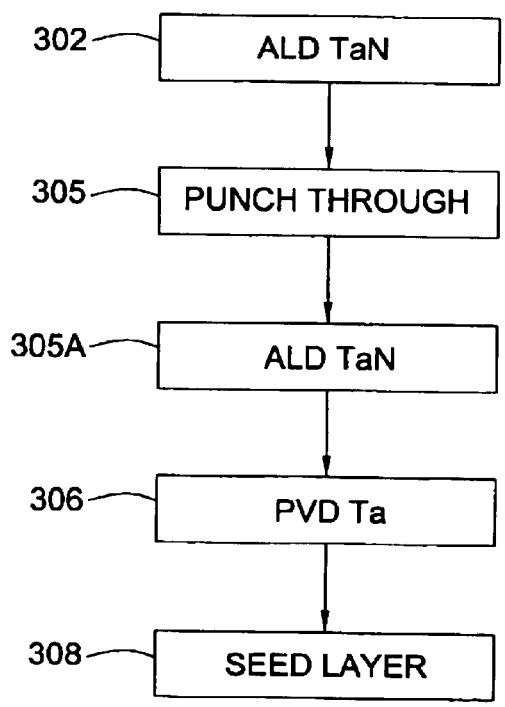
FIG. 3B illustrates an embodiment of a process utilizing two ALD tantalum nitride deposition steps in the formation of metal interconnect structures.

FIG. 3B illustrates yet another embodiment of a process of utilizing ALD tantalum nitride layer in one stage in the formation of metal interconnect structures. In step 302, tantalum nitride is deposited by atomic layer deposition over a substrate structure. In step 305, the tantalum nitride layer is exposed to a punch through step. An additional tantalum nitride layer is deposited in step 305A. In step 306, an optional tantalum layer may be deposited over the plasma-treated tantalum nitride layer. In step 308, a seed layer is formed over the resultant substrate structure of step 304 or 306. All or a partial number of steps 302 through 308 may be performed on an integrated processing system, such as the system of FIG. 4.

Experimental Results

Figure 12:
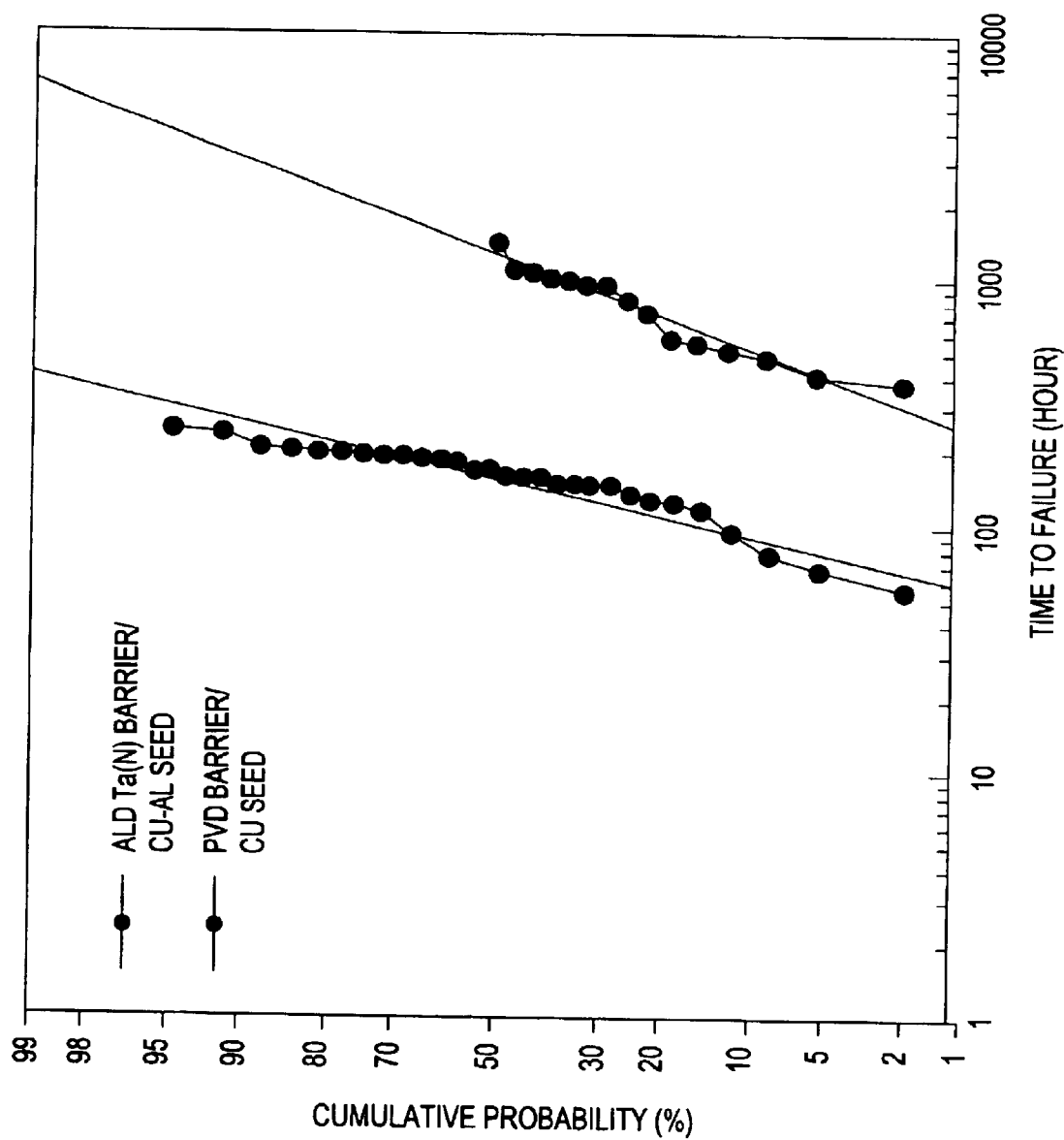
FIG. 12 compares cumulative probability as a function of time to failure for ALD tantanlum nitride with copper-aluminum seed and PVD barrier with copper seed.

FIG. 12 illustrates the cumulative probability as a function of time to failure for ALD tantalum nitride barrier with a copper aluminum seed and for a PVD barrier with a copper seed. The lifetime distribution is improved with the copper aluminum alloy seed used with an ALD tantalum nitride barrier.

Figure 13:
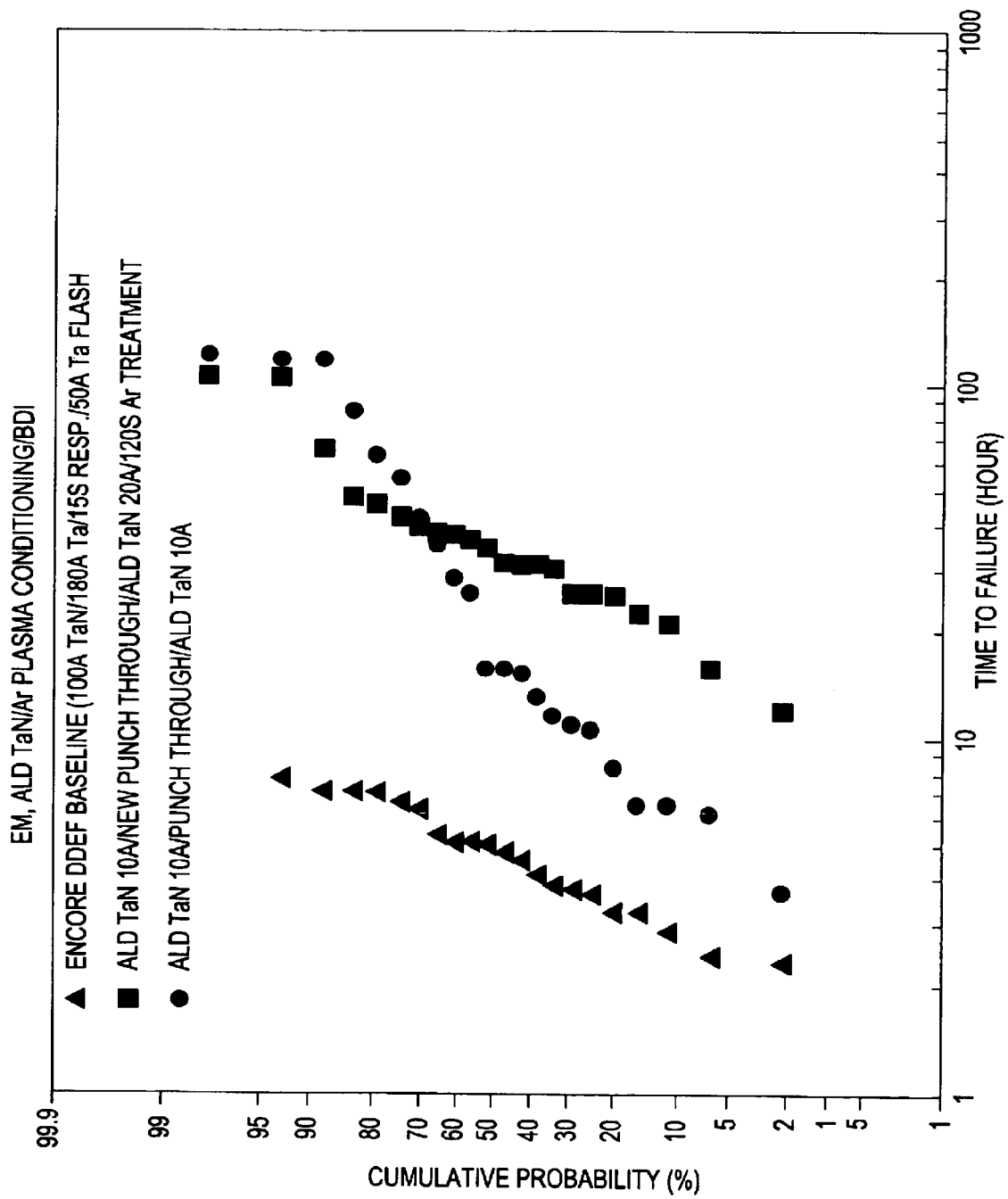
FIG. 13 compares cumulative probability as a function of time to fail for ALD tantalum nitride with punchthrough and ALD tantalum nitride layers; ALD tantalum nitride with new punchthrough, ALD tantalum nitride layers, and argon treatment; and a baseline with tantalum nitride, tantalum, and tantalum flash.

FIG. 13 compares cumulative probability as a function of time to failure for ALD tantalum nitride with punchthrough and ALD tantalum nitride layers; ALD tantalum nitride with new punchthrough ALD tantalum nitride layers, and argon treatment; and a baseline with tantalum nitride, tantalum, and tantalum flash. The temperature was 350° C. There was 1.5 ma/cm$^2$ link current density. There was upstream direction current. Flow was proportional to (μm) via/link size. Old punchthrough had DC power less than 150 W and a wafer bias of 600 W. New punchthrough had DC power of 3000 W and a wafer bias of 800 W. This dramatic increase in time to failure illustrates the desirable properties of the improvement.

Final Steps

Referring to FIG. 1, 2, 3A, or 3B subsequent to seed layer formation in step 410, step 708, or step 808, a bulk metal layer is at least partially deposited on the seed layer. The metal layer may also be deposited using any conventional deposition technique, such as electroplating, electroless plating, chemical vapor deposition (CVD), or physical vapor deposition (PVD). The metal layer preferably includes any conductive material such as copper, aluminum, tungsten, or combinations thereof. The metal layer preferably comprises a bulk copper layer.

In one embodiment, preferably, the bulk copper layer is formed within an electroplating cell, such as the ElectraTM Cu ECP system, available from Applied Materials, Inc., of Santa Clara, Calif. A copper electrolyte solution and copper electroplating technique is described in commonly assigned U.S. Pat. No. 6,113,771, entitled "Electro-deposition Chemistry", which is incorporated by reference herein. Typically, the electroplating bath has a copper concentration greater than about 0.7M, a copper sulfate concentration of about 0.85, and a pH of about 1.75. The electroplating bath may also contain various additives as is well known in the art. The temperature of the bath is between about 15° C. and about 250°. The bias is between about −15 volts to about 15 volts. In one aspect, the positive bias ranges from about 0.1 volts to about 10 volts and the negatives bias ranges from about −0.1 to about −10 volts.

Optionally, an anneal treatment may be performed following the metal layer deposition. For example, the wafer may be subjected to a temperature between about 100° C. and about 400° C. for between about 1 minute to about 1 hour. A carrier/purge gas such as helium, hydrogen, nitrogen, or a mixture thereof is introduced at a rate of about 100 sccm to about 10,000 sccm. The chamber pressure is maintained between about 2 Torr and about 10 Torr.

Following deposition, the top portion of the resulting structure may be planarized. A chemical mechanical polishing (CMP) apparatus may be used, such as the MirraTM System available from Applied Materials, Santa Clara, Calif., for example. Optionally, the intermediate surfaces of the structure may be planarized between the deposition of the subsequent layers described above.

While the foregoing is directed to embodiments of the present invention, other and further embodiments of the invention may be devised without departing from the basic scope thereof, and the scope thereof is determined by the claims that follow.

What is claimed is:

1. A method of forming a metal interconnect on a semiconductor substrate, comprising;
    cleaning features formed in a dielectric layer and exposing a conductive material underlying the dielectric layer by generating a plasma in a remote plasma source, delivering radicals from the plasma to a first process chamber which contains the substrate, and contacting the features formed in the dielectric layer with the radicals prior to a barrier layer deposition;
    depositing a tantalum nitride layer by atomic layer deposition within the features at a pressure between 1 and 10 Torr at a temperature between 200 and 300° C. in a second process chamber;
    depositing a tantalum layer by physical vapor deposition over the tantalum nitride layer in a third process chamber;
    plasma etching the tantalum layer and the tantalum nitride in a fourth process chamber to remove at least a portion of the tantalum layer and tantalum nitride layer at the bottom of the feature to reveal the conductive material;
    optionally depositing additional tantalum or copper by physical vapor deposition on the tantalum layer; and
    depositing a seed layer over the conductive material and the tantalum layer in a fifth processing chamber,
    wherein the first processing chamber, the second processing chamber, the third processing chamber, the fourth processing chamber, and the fifth processing chamber are located in an integrated tool.

2. The method of claim 1, wherein the tantalum nitride deposition is performed with a tantalum containing precursor selected from the group comprising t-butylimino-tris (diethylamino)tantalum, pentakis(ethylmethylamino) tantalum, pentakis(dimethylamino)tantalum, pentakis (diethylamino)tantalum, t-butyliminotris(diethyl methylamino)tantalum, t-butylimino-tris(dimethylamino) tantalum, bis(cyclopentadienyl)tantalum trihydride, and bis (methylcyclopentadienyl)tantalum trihydride.

3. The method of claim 1, wherein the tantalum nitride deposition is performed with a nitrogen containing precursor selected from the group comprising ammonia, hydrazine, methylhydrazine, dimethylhydrazine, t-butylhydrazine, phenylhydrazine, azoisobutane, and ethylazide.

4. The method of claim 1, wherein the tantalum nitride deposition is performed with the tantalum containing precursor pulsed into the chamber at 100 to 3,000 sccm for 2.0 seconds or less.

5. The method of claim 1, wherein the tantalum nitride deposition is performed with the nitrogen containing precursor pulsed into the chamber at 100 to 3,000 sccm for 2.0 seconds or less.

6. The method of claim 1, wherein the tantalum nitride deposition is performed with argon flowing continuously into the chamber at 1,000 to 10,000 sccm.

7. The method of claim 1, wherein the plasma etching is performed with a gas selected from the group consisting of argon, nitrogen, and hydrogen.

8. The method of claim 1, wherein the plasma etching is performed with RF power of 100 to 1000 W for 1 to 20 seconds.

9. The method of claim 1, wherein the plasma etching is performed with a directional argon plasma.

10. The method of claim 1, further comprising depositing additional metal by physical vapor deposition on the tantalum layer.

11. The method of claim 16, further comprising depositing a bulk metal layer.

12. The method of claim 1, wherein the third and fourth process chambers are the same chamber.

13. The method of claim 1, wherein the fourth and fifth process chambers are the same chamber.

14. The method of claim 10, wherein the metal is selected from the group consisting of copper, copper aluminum, copper tin, tantalum, tungsten, thallium, cobalt, titanium, and aluminum.

15. The method of claim 1, wherein the seed layer is deposited by a method selected from the group consisting of chemical vapor deposition, physical vapor deposition, electroplating, and electroless plating.

16. The method of claim 1, wherein the seed layer comprises a metal selected from the group consisting of copper, copper aluminum, copper tin, tantalum, tungsten, thallium, cobalt, titanium, and aluminum.

17. The method of claim 1, further comprising a preliminary substrate surface cleaning with nitrogen before cleaning features formed in a dielectric layer and exposing a conductive material underlying the dielectric layer by generating a plasma in a remote plasma source, delivering radicals from the plasma to a first process chamber which contains the substrate, and contacting the features formed in the dielectric layer with the radicals prior to a barrier layer deposition.

18. A method of forming a metal interconnect on a semiconductor substrate, comprising;
cleaning features formed in a dielectric layer and exposing a conductive material underlying the dielectric layer by generating a plasma in a remote plasma source, delivering radicals from the plasma to a first process chamber which contains the substrate, and contacting the features formed in the dielectric layer with the radicals prior to a barrier layer deposition;
depositing a tantalum nitride layer by atomic layer deposition within the features at a pressure between 1 and 10 Torr at a temperature between 200 and 300° C. in a second process chamber;
depositing a tantalum layer by physical vapor deposition over the tantalum nitride layer in a third process chamber;
plasma etching the tantalum layer and the tantalum nitride in the third process chamber to remove at least a portion of the tantalum layer and the tantalum nitride layer at the bottom of the feature to reveal the conductive material;
optionally depositing additional tantalum or copper by physical vapor deposition on the tantalum layer; and
depositing a seed layer over the conductive material and the tantalum layer in a fourth processing chamber,
wherein the first processing chamber, the second processing chamber, the third processing chamber, and the fourth processing chamber are located in an integrated tool.

19. The method of claim 18, wherein the cleaning is performed with a feed gas consisting of 0 to about 10 percent hydrogen and about 90 to 100 percent helium.

20. The method of claim 18, wherein the plasma etching is performed with a directional argon plasma.

21. The method of claim 18, further comprising depositing additional metal by physical vapor deposition to the tantalum layer.

22. The method of claim 18, wherein the second and third process chambers are the same chamber.

23. The method of claim 18, wherein the third and fourth process chambers are the same chamber.

24. The method of claim 18, wherein the seed layer is deposited by a method selected from the group consisting of chemical vapor deposition, physical vapor deposition, electroplating, and electroless plating.

25. The method of claim 18, further comprising depositing additional metal by physical vapor deposition to the tantalum layer.

26. The method of claim 25, further comprising depositing a bulk metal layer.

27. A method of forming a metal interconnect on a semiconductor substrate, comprising:
depositing a tantalum nitride barrier layer by atomic layer deposition within the features at a pressure between 1 and 10 Torr at a temperature between 200 and 300°C. in a first process chamber;
depositing a second barrier layer over the tantalum nitride barrier layer in a second process chamber;
plasma etching the second barrier layer and the tantalum nitride barrier layer in a third process chamber to remove at least a portion of the second barrier layer and the tantalum nitride barrier layer at a bottom of the feature to reveal the conductive material; and
depositing a seed layer over the conductive material and the second barrier layer in a fourth processing chamber,
wherein the first processing chamber, the second processing chamber, the third processing chamber, and the fourth processing chamber are located in an integrated tool.

28. The method of claim 27, wherein the tantalum nitride deposition is performed with a tantalum containing precursor selected from the group consisting of t-butylimino-tris (diethylamino)tantalum, pentakis (ethylmethylamino) tantalum, pentakis(dimethylamino)tantalum, pentakis (diethylamino)tantalum, t-butylimiotris (diethyl methylamino)tantalum, t-butylimino-tris(dimethylamino) tantalum, bis(cyclopentadienyl)tantalum trihydride, and bis (methylcyclopentadienyl) tantalum trihydride.

29. The method of claim 27, wherein the tantalum nitride deposition is performed with a nitrogen containing precursor selected from the group consisting of ammonia, hydrazine, methylhydrazine, dimethylhydrazine, t-butylhydrazine, phenylhydrazine, azoisobutane, and ethylazide.

30. The method of claim 27, wherein the plasma etching is performed with a gas selected from the group consisting of argon, nitrogen, and hydrogen.

31. The method of claim 27, wherein the plasma etching is performed with a directional argon plasma.

32. The method of claim 27, further comprising depositing additional metal by physical vapor deposition on the second barrier layer.

33. The method of claim 32, further comprising depositing a bulk metal layer.

34. The method of claim 27, wherein the third and fourth process chambers are the same chamber.

35. The method of claim 27, wherein the fourth and fifth process chambers are the same chamber.

36. The method of claim 32, wherein the metal is selected from the group consisting of copper, copper aluminum, copper tin, tantalum, tungsten, thallium, cobalt, titanium, and aluminum.

37. The method of claim 27, wherein the seed layer is deposited by a method selected from the group consisting of chemical vapor deposition, physical vapor deposition, electroplating, and electroless plating.

38. The method of claim 27, wherein the seed layer comprises a metal selected from the group consisting of copper, copper aluminum, copper tin, tantalum, tungsten, thalium, cobalt, titanium, and aluminum.

39. The method of claim 27, further comprising a preliminary substrate surface cleaning with nitrogen before cleaning features formed in a dielectric layer and exposing a conductive material underlying the dielectric layer by generating a plasma in a remote plasma source, delivering radicals from the plasma to a first process chamber which contains the substrate, and contacting the features formed in the dielectric layer with radicals prior to a barrier layer deposition.

40. A method of forming a metal interconnect on a semiconductor substrate, comprising;
cleaning features formed in a dielectric layer and exposing a conductive material underlying the dielectric layer by generating a plasma in a remote plasma source, delivering radicals from the plasma to a first process chamber which contains the substrate, and contacting the features formed in the dielectric layer with the radicals prior to a barrier layer deposition;
depositing a tantalum nitride barrier layer by atomic layer deposition within the features at a pressure between 1 and 10 Torr at a temperature between 200 and 300°C. in a second process chamber;

depositing a second barrier layer by physical vapor deposition over the tantalum nitride barrier layer in a third process chamber;

optionally depositing additional tantalum or copper by physical vapor deposition on the second barrier layer; and depositing a seed layer over the conductive material and the second barrier layer in a fourth processing chamber, wherein the first processing chamber, the second processing chamber, the third processing chamber, and the fourth processing chamber are located in an integrated tool.

41. The method of claim 40, wherein the cleaning is performed with a feed gas consisting of 0 to about 10 percent hydrogen and about 90 to 100 percent helium.

42. The method of claim 40, wherein the tantalum nitride barrier deposition is performed with a tantalum containing precursor selected from the group consisting of t-butylimino-tris(diethylamino)tantalum, pentakis (ethylmethylamino)tantalum, pentakis(dimethylamino) tantalum, pentakis (diethylamino)tantalum, t-butyliminotris (diethyl methylamino)tantalum, t-butylimino-tris (dimethylamino)tantalum, bis(cyclopentaadienyl)tantalum, and bis(methylcyclopentadienyl) tantalum trihydride.

43. The method of claim 40, wherein the tantalum nitride barrier deposition is performed with a nitrogen containing precursor selected from the group consisting of ammonia, hydrazine, methylhydrazine, dimethylhydrazine, t-butylhydrazine, phenylhydrazine, azoisobutane, and ethylazide.

44. The method of claim 40, wherein the tantalum nitride barrier deposition is performed with the tantalum containing precursor pulsed into the chamber at 100 to 3,000 sccm for 2.0 seconds or less.

45. The method of claim 40, wherein the tantalum nitride barrier deposition is performed with the nitrogen containing precursor pulsed into the chamber at 100 to 3,000 sccm for 2.0 seconds or less.

46. The method of claim 40, wherein the tantalum nitride barrier deposition is performed with argon flowing continuously into the chamber at 1,000 to 10,000 sccm.

47. The method of claim 40, wherein the second barrier layer is tantalum and deposition is performed at 10 to 50°C. and wafer bias is 100 to 1000W.

48. The method of claim 40, further comprising depositing additional metal by physical vapor deposition on the second barrier layer.

49. The method of claim 48, further comprising depositing a bulk metal layer.

50. The method of claim 40, wherein the third and fourth process chambers are the same chamber.

51. The method of claim 40, wherein the fourth and fifth process chambers are the same chamber.

52. The method of claim 48, wherein the metal is selected from the group consisting of copper, copper aluminum, copper tin, tantalum, tungsten, thallium, cobalt, titanium, and aluminum.

53. The method of claim 40, wherein the seed layer is deposited by a method selected from the group consisting of chemical vapor deposition, physical vapor deposition, electroplating, and electroless plating.

54. The method of claim 40, wherein the seed layer comprises a metal selected from the group consisting of copper, copper aluminum, copper tin, tantalum, tungsten, thallium, cobalt, titanium, and aluminum.

55. The method of claim 40, further comprising a preliminary substrate surface cleaning with nitrogen before cleaning features formed in a dielectric layer and exposing a conductive material underlying the dielectric layer by generating a plasma in a remote plasma source, delivering radicals from the plasma to a first process chamber which contains the substrate, and contacting the features formed in the dielectric layer with the radicals prior to a barrier layer deposition.

* * * * *

UNITED STATES PATENT AND TRADEMARK OFFICE
CERTIFICATE OF CORRECTION

PATENT NO. : 7,049,226 B2  Page 1 of 1
APPLICATION NO. : 10/865042
DATED : May 23, 2006
INVENTOR(S) : Chung et al.

It is certified that error appears in the above-identified patent and that said Letters Patent is hereby corrected as shown below:

In the Specification

Column 3, Line 24: Change "exemeplary" to --exemplary--

Column 6, Line 38: Insert a period after "surface"

Column 6, Line 50: change "wore" to --wire--

Column 7, Line 51: Change "t-butyliminotrislethylmethylamino)" to --t-butyliminotris (ethylmethylamino)--

Column 10, Line 11: Delete "rubidium"

Column 10, Line 37: Insert a period after "tantalum"

Column 10, Line 62: Delete the second instance of "The"

Column 11, Lines 64 and 65: Change each instance of "A" to --Å--

In the Claims

Column 16, Claim 38, Line 47: Change "thalium" to --thallium--

Column 17, Claim 42, Line 26: Change "bis(cyclopentaadienyl)tantalum" to --bis(cyclopentadienyl)tantalum trihydride--

Signed and Sealed this

Nineteenth Day of December, 2006

JON W. DUDAS
*Director of the United States Patent and Trademark Office*

UNITED STATES PATENT AND TRADEMARK OFFICE
CERTIFICATE OF CORRECTION

PATENT NO. : 7,049,226 B2
APPLICATION NO. : 10/865042
DATED : May 23, 2006
INVENTOR(S) : Chung et al.

Page 1 of 1

It is certified that error appears in the above-identified patent and that said Letters Patent is hereby corrected as shown below:

<u>In the Specification</u>

Column 3, Line 24: Change "exemeplary" to --exemplary--

Column 6, Line 38: Insert a period after "surface"

Column 6, Line 50: change "wore" to --wire--

Column 7, Line 51: Change "t-butyliminotrislethylmethylamino)" to --t-butyliminotris(ethylmethylamino)--

Column 10, Line 11: Delete "rubidium"

Column 10, Line 37: Insert a period after "tantalum"

Column 10, Line 62: Delete the second instance of "The"

Column 11, Lines 64 and 65: Change each instance of "A" to --Å--

<u>In the Claims</u>

Column 16, Claim 38, Line 47: Change "thalium" to --thallium--

Column 17, Claim 42, Line 26: Change "bis(cyclopentaadienyl)tantalum" to --bis(cyclopentadienyl)tantalum trihydride--

Signed and Sealed this

Twentieth Day of February, 2007

JON W. DUDAS
*Director of the United States Patent and Trademark Office*